(12) United States Patent
Lim et al.

(10) Patent No.: US 12,707,637 B2
(45) Date of Patent: Aug. 11, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Suhwan Lim, Hanam-si (KR); Sanghoon Kim, Hwaseong-si (KR); Chungje Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 723 days.

(21) Appl. No.: 18/053,484

(22) Filed: Nov. 8, 2022

(65) Prior Publication Data

US 2023/0165002 A1 May 25, 2023

(30) Foreign Application Priority Data

Nov. 19, 2021 (KR) ........................ 10-2021-0160437

(51) Int. Cl.
*H10B 41/10* (2023.01)
*H10B 41/27* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 41/00; H10B 41/27; H10B 41/35; H10B 41/40
See application file for complete search history.

(56) References Cited

U.S. PATENT DOCUMENTS 4,040,878 A * 8/1977 Rowe .................. H01L 21/2254 438/560
9,520,408 B2 * 12/2016 Kim ...................... H01L 23/535
(Continued)

FOREIGN PATENT DOCUMENTS

CN 112687699 A * 4/2021
KR 102136849 B1 7/2020
(Continued)

OTHER PUBLICATIONS

Office Action in Korean Appln. No. 10-2021-0160437, mailed on Jul. 31, 2025, 11 pages (with English translation).

*Primary Examiner* — William B Partridge
*Assistant Examiner* — Felix B Andrews
(74) *Attorney, Agent, or Firm* — Fish & Richardson P.C.

(57) ABSTRACT

A semiconductor device includes a lower structure; a pattern structure including first to third pattern layers sequentially stacked on the lower structure; gate electrodes stacked on the pattern structure and spaced apart from each other in a first direction that is perpendicular to an upper surface of the pattern structure, and a channel structure passing through the gate electrodes. The channel structure includes a channel layer and a metal-semiconductor compound layer. The metal-semiconductor compound layer contacts the channel layer and the second pattern layer. The channel structure passes through the second and third pattern layers and extends into the first pattern layer. The second pattern layer has a first metal layer contacting the metal-semiconductor compound layer. At least a portion of the metal-semiconductor compound layer overlaps the lower gate electrode in a second direction perpendicular to the first direction.

20 Claims, 30 Drawing Sheets

(51) Int. Cl.

| | |
|---|---|
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |

(52) U.S. Cl.
CPC ............. *H10B 41/40* (2023.02); *H10B 43/10* (2023.02); *H10B 43/35* (2023.02); *H10B 43/40* (2023.02)

(56) References Cited

U.S. PATENT DOCUMENTS

| | | | | |
|---|---|---|---|---|
| 9,754,670 | B1 | 9/2017 | Choi | |
| 9,837,165 | B2 | 12/2017 | Lee et al. | |
| 10,658,295 | B2 | 5/2020 | Kawai et al. | |
| 12,029,039 | B2 * | 7/2024 | Huang | H10B 43/35 |
| 2016/0233227 | A1 * | 8/2016 | Zhang | H10B 41/35 |
| 2019/0326315 | A1 * | 10/2019 | Lee | H10D 62/292 |
| 2019/0371816 | A1 | 12/2019 | Huang et al. | |
| 2020/0350330 | A1 * | 11/2020 | Ahn | H10B 41/35 |
| 2021/0233928 | A1 | 7/2021 | Lee | |

FOREIGN PATENT DOCUMENTS

| | | | | |
|---|---|---|---|---|
| KR | 10-2021-0032920 A | | 3/2021 | |
| KR | 20230033999 A | * | 3/2023 | G11C 16/08 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2021-0160437, filed on Nov. 19, 2021 in the Korean Intellectual Property Office, the disclosure of which is incorporated herein by reference in its entirety.

BACKGROUND

Inventive concepts relate to a semiconductor device and/or a data storage system including the same.

In an electronic system requiring data storage, a semiconductor device for storing high-capacity data may be required. Accordingly, methods for increasing the data storage capacity of semiconductor devices are being researched. For example, as a method for increasing the data storage capacity of a semiconductor device, a semiconductor device including memory cells arranged three-dimensionally, instead of memory cells arranged two-dimensionally, has been proposed.

SUMMARY

An aspect of inventive concepts is to provide a semiconductor device and/or a data storage system having improved electrical characteristics.

According to an embodiment of inventive concepts, a semiconductor device may include a lower structure, a pattern structure, a plurality of gate electrodes, and a channel structure. The pattern structure may include a first pattern layer, a second pattern layer, and a third pattern layer. The first pattern layer, the second pattern layer, and the third pattern layer may be sequentially stacked on the lower structure. The second pattern layer may have a first metal layer. The plurality of gate electrodes may be stacked on the pattern structure and may be spaced apart from each other in a first direction. The first direction may be perpendicular to an upper surface of the pattern structure. The plurality of gate electrodes may include a lower gate electrode in a lower portion within the plurality of gate electrodes. The channel structure may pass through the plurality of gate electrodes. The channel structure may include a channel layer and a metal-semiconductor compound layer. The metal-semiconductor compound layer may be in contact with the channel layer and the second pattern layer. The channel structure may pass through at least the second pattern layer and the third pattern layer. The channel structure may extend into the first pattern layer. The metal-semiconductor compound layer may contact the first metal layer of the second pattern layer. At least a portion of the metal-semiconductor compound layer may overlap the lower gate electrode in a second direction. The second direction may be perpendicular to the first direction.

According to an embodiment of inventive concepts, a semiconductor device may include a first horizontal conductive layer including a metal layer; a second horizontal conductive layer on the first horizontal conductive layer; a plurality of gate electrodes stacked on the second horizontal conductive layer and spaced apart from each other in a first direction, the first direction being perpendicular to an upper surface of the first horizontal conductive layer; and a channel structure passing through the plurality of gate electrodes and the second horizontal conductive layer. The channel structure may include a channel layer and a lower metal-semiconductor compound layer. The lower metal-semiconductor compound layer may be in contact with the channel layer and the first horizontal conductive layer. The first horizontal conductive layer may be in contact with a lower surface of the second horizontal conductive layer. The first horizontal conductive layer may cover at least a portion of a side surface of the second horizontal conductive layer. The lower metal-semiconductor compound layer may extend in a direction facing the plurality of gate electrodes from a region contacting the first horizontal conductive layer. A level of an upper surface of the lower metal-semiconductor compound layer may be higher than an upper surface of the second horizontal conductive layer.

According to an embodiment of inventive concepts, a data storage system may include a semiconductor storage device and a controller. The semiconductor storage device may include a lower structure including circuit elements, a pattern structure including a plurality of pattern layers sequentially stacked on the lower structure, a plurality of gate electrodes stacked on the pattern structure and spaced apart from each other in a first direction, a channel structure passing through the plurality of gate electrodes, and an input/output pad electrically connected to the circuit elements. The plurality of pattern layers may include a first pattern layer, a second pattern layer, and a third pattern layer. The first direction may be perpendicular to an upper surface of the pattern structure. The plurality of gate electrodes may include a lower gate electrode in a lower portion within the gate electrodes. The channel structure may include a channel layer and a metal-semiconductor compound layer. The metal-semiconductor compound layer may be in contact with the channel layer and the second pattern layer. The channel structure may pass through at least the second pattern layer and the third pattern layer, and the channel may extend into the first pattern layer. The second pattern layer may have a first metal layer contacting the metal-semiconductor compound layer. At least a portion of the metal-semiconductor compound layer may overlap the lower gate electrode in a second direction. The second direction may be perpendicular to the first direction. The controller electrically may be connected to the semiconductor storage device through the input/output pad and configured to control the semiconductor storage device.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of inventive concepts will be described with reference to the accompanying drawings.

Figure 1:
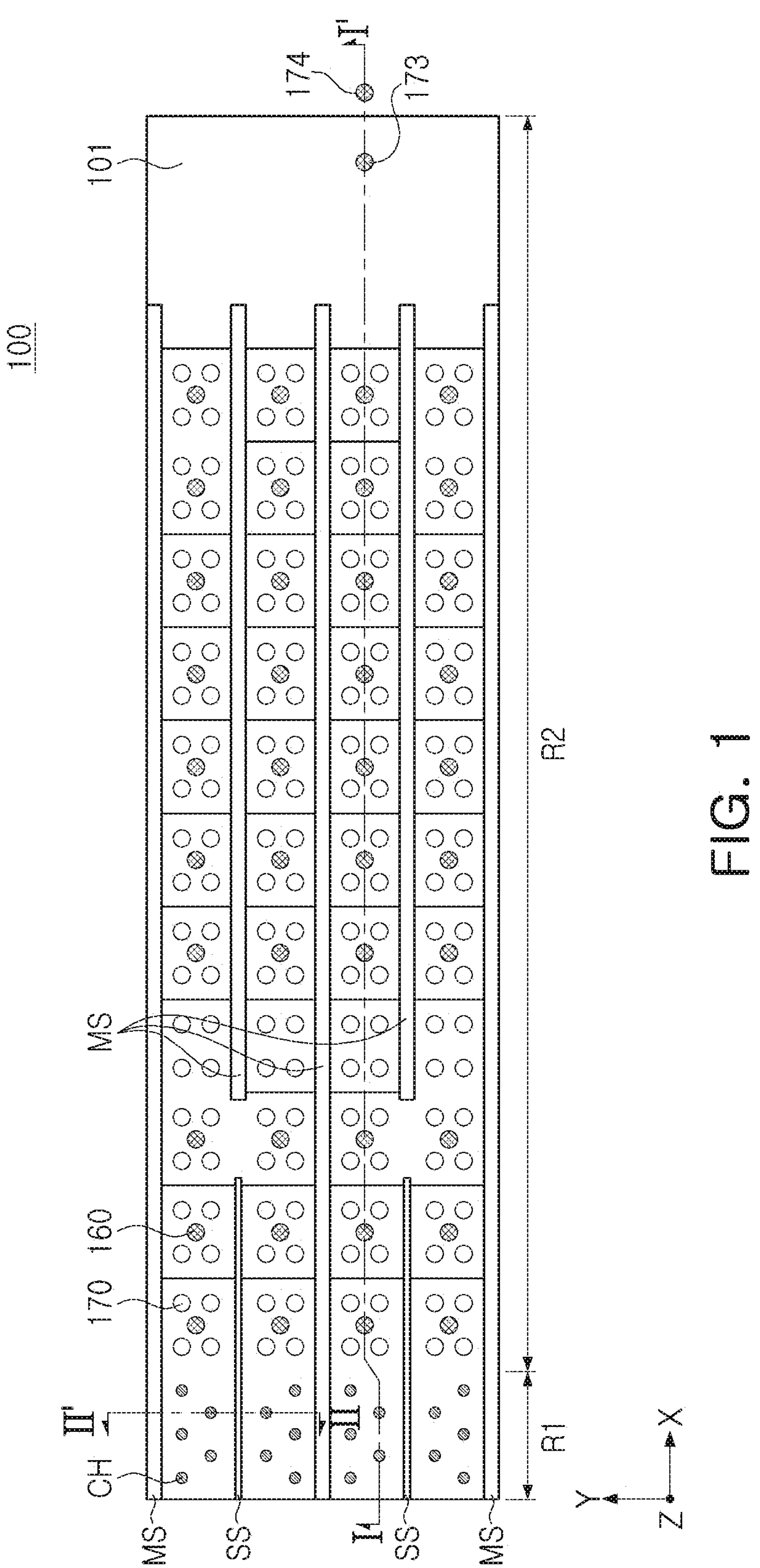
FIG. 1 is a plan view illustrating a semiconductor device according to an example embodiment.
Figure 2A:
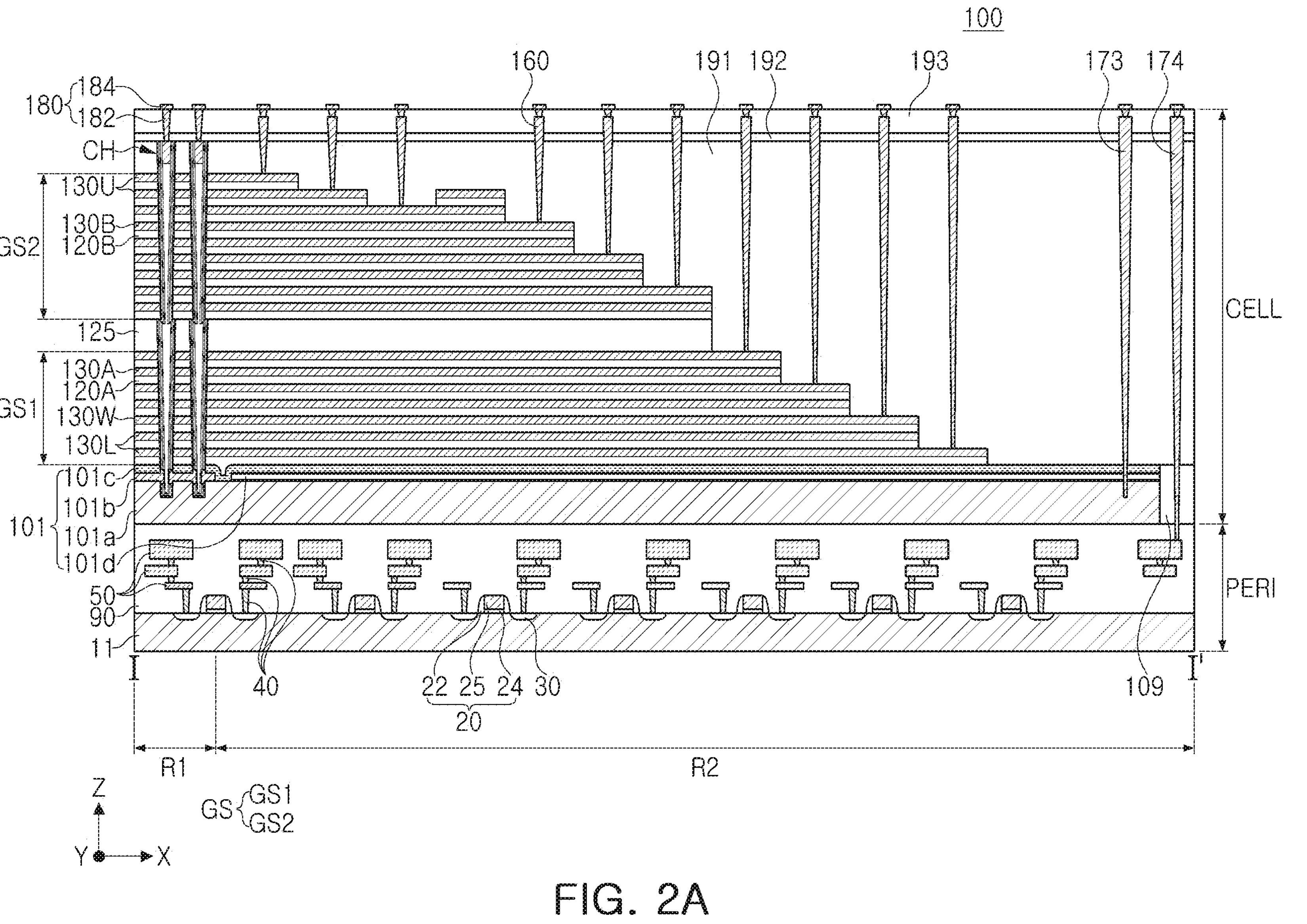
FIGS. 2A and 2B are cross-sectional views illustrating a semiconductor device according to an example embodiment.
Figure 2B:
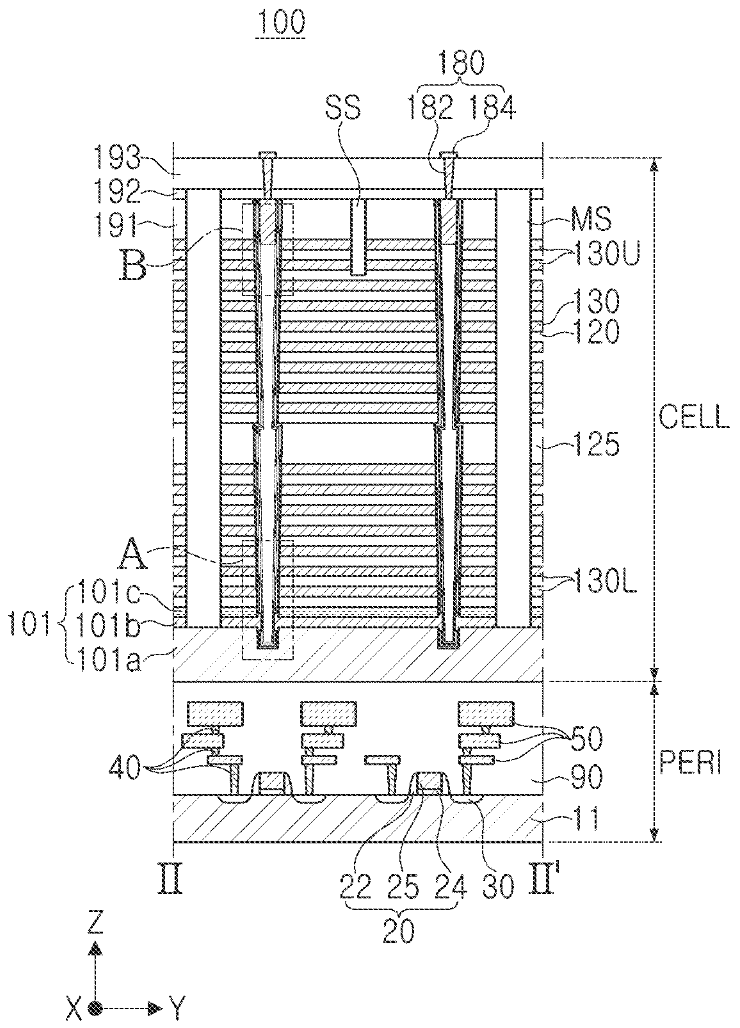

FIG. 1 is a plan view illustrating a semiconductor device 100 according to an example embodiment, and FIGS. 2A and 2B are cross-sectional views illustrating a semiconductor device 100 according to an example embodiment. FIG. 2A is a cross-sectional view of the semiconductor device 100 of FIG. 1, taken along line I-I'. FIG. 2B is a cross-sectional view of the semiconductor device 100 of FIG. 1, taken along line II-II'.

Referring to FIGS. 1 to 2B, a semiconductor device 100 may include a memory cell structure CELL and a peripheral circuit structure PERI, stacked vertically. The memory cell structure CELL may be disposed on the peripheral circuit structure PERI. Conversely, in some embodiments, the memory cell structure CELL may be disposed below the peripheral circuit structure PERI.

The peripheral circuit structure PERI may include a first substrate 11, and circuit elements 20 disposed on the first substrate 11, circuit contact plugs 40, and circuit wiring lines 50.

The first substrate 11 may have an upper surface extending in an X-direction and a Y-direction. In the first substrate 11, device isolation layers may be formed to define an active region. Source/drain regions 30 including impurities may be disposed in some of the active regions. The first substrate 11 may include a semiconductor material, for example, a group IV semiconductor, a group III-V compound semiconductor, or a group II-VI compound semiconductor. The first substrate 11 may be provided as a bulk wafer or an epitaxial layer. In this specification, the first substrate 11 of the peripheral circuit structure PERI may be referred to as a 'base substrate.'

The circuit elements 20 may include a transistor. For example, the transistor among the circuit elements 20 may include a circuit gate dielectric layer 22, a spacer layer 24, and a circuit gate electrode 25. The source/drain regions 30 may be disposed in the first substrate 11 on both sides of the circuit gate electrode 25.

In an example embodiment, the peripheral circuit structure PERI may further include a peripheral region insulating layer 90 on the first substrate 11 and covering the circuit elements 20. The circuit contact plugs 40 may pass through a portion of the peripheral region insulating layer 90, to be electrically connected to the circuit elements 20. An electrical signal may be applied to the circuit elements 20 by the circuit contact plugs 40. The circuit wiring lines 50 may be connected to the circuit contact plugs 40, and may be arranged as a plurality of layers.

The memory cell structure CELL may include a second substrate 101 having a first region R1 and a second region R2, a stack structure GS including interlayer insulating layers 120 and gate electrodes 130, alternately stacked on the second substrate 101, separation structures MS extending and passing through the stack structure GS, and a channel structure CH passing through the stack structure GS and including a channel layer 140. In an example embodiment, the memory cell structure CELL may further include upper separation structures SS, upper insulating layers 191, 192, and 193, contact structures 160 and 170, peripheral contact plugs 173 and 174, and an upper wiring structure 180. The circuit elements 20 of the peripheral circuit structure PERI may be electrically connected to the gate electrodes 130 and/or the channel structure CH of the memory cell structure CELL.

A region on the first region R1 of the second substrate 101 may be a region in which the gate electrodes 130 are vertically stacked and the channel structure CH is disposed, and memory cells may be disposed therein. The gate electrodes 130 on the first region R1 of the second substrate 101 may extend to have a stepped shape on a region on the second region R2 of the second substrate 101. The region on the second region R2 may be a region for electrically connecting the memory cells to the peripheral circuit structure PERI. In an example embodiment, the region on the first region R1 may be referred to as a 'memory cell region' or a 'memory cell array region' in which memory cells are disposed, and the region on the second region R2 may be referred to as a 'step region' in which the gate electrodes 130 form a stepped shape, an 'extension region' or a 'connection region' in which the gate electrodes 130 extend to have different lengths. In this specification, the second substrate 101 may be referred to as a 'pattern structure.'

In an example embodiment, the second substrate 101 may include a first pattern layer 101*a*, a second pattern layer 101*b*, a third pattern layer 101*c*, and a fourth pattern layer 101*d*. According to some embodiments, the second substrate 101 may include only the first pattern layer 101*a* without including the second to fourth pattern layers 101*b*, 101*c*, and 101*d*. In this specification, the first pattern layer 101*a* may be referred to as a 'substrate,' the second pattern layer 101*b* may be referred to as a 'first horizontal conductive layer,' and the third pattern layer 101*c* may be referred to as a 'second horizontal conductive layer.'

The first pattern layer 101*a* may have an upper surface extending in the X-direction and the Y-direction. In example embodiments, the first pattern layer 101*a* may have a thickness, thinner than a thickness of the first substrate 11, but inventive concepts are not limited thereto. The first pattern layer 101*a* may have a thickness, thicker than a thickness of each of the second pattern layer 101*b*, the third pattern layer 101*c*, and the fourth pattern layer 101*d*. The first pattern layer 101*a* may include a silicon layer. The first pattern layer 101*a* may further include impurities. For example, the first pattern layer 101*a* may include silicon having n-type conductivity. The first pattern layer 101*a* may include polycrystalline silicon having n-type conductivity. A material of the first pattern layer 101*a* may not be limited to a semiconductor material, and may include a conductive material such as a metal material or the like.

The second pattern layer 101*b* may be disposed on the first pattern layer 101*a*. The second pattern layer 101*b* may be disposed on the first region R1 of the second substrate 101. The second pattern layer 101*b* may function as at least a portion of a common source line CSL of the semiconductor device 100 (refer to FIG. 8), and, for example, may function as the common source line CSL, together with the first pattern layer 101*a*. In an example embodiment, the second pattern layer 101*b* may include a metal layer, and the metal layer may include at least one of tungsten (W), titanium (Ti), cobalt (Co), or nickel (Ni). As the second pattern layer 101*b* is formed of a metal material, wiring resistance of the second pattern layer 101*b* may be relatively reduced. Therefore, a semiconductor device having improved electrical performance may be provided. For example, as the second pattern layer 101*b* constituting at least a portion of the common source line is formed of a metal layer, a resistance value of the second pattern layer 101*b* may be relatively low, and common source line CSL noise may be improved. The common source line noise may include a series of issues generated by a non-uniform resistance value of a wiring as lengths of wirings are different from the peripheral contact plugs 173 and 174 or the separation structures MS to each of the plurality of channel structures CH.

The fourth pattern layer 101*d* may be spaced apart from the second pattern layer 101*b* on the first pattern layer 101*a*, and may be disposed to be parallel to the second pattern layer 101*b*. The fourth pattern layer 101*d* may be disposed on the second region R2 of the second substrate 101. In an example embodiment, the fourth pattern layer 101*d* may be layers remaining after a portion of the fourth pattern layer 101*d* is replaced with the second pattern layer 101*b* in the manufacturing process of the semiconductor device 100. The fourth pattern layer 101*d* may include at least one of silicon oxide, silicon nitride, silicon carbide, or silicon oxynitride. The fourth pattern layer 101*d* may include first to third horizontal insulating layers sequentially stacked, and the first to third horizontal insulating layers may include, for example, a silicon oxide layer, a silicon nitride layer, and a silicon oxide layer, sequentially stacked. The first and third horizontal insulating layers may include the same material as each other, and may include a material different from that of the second horizontal insulating layer. According to embodiments, a region corresponding to the fourth pattern layer 101*d* may be the same metal layer as the second pattern layer 101*b*. For example, the fourth pattern layer 101*d* on the second region R2 may be also replaced with a metal layer, together, by a process in which the fourth pattern layer 101*d* on the first region R1 may be replaced with the second pattern layer 101*b*, or a subsequent process.

The third pattern layer 101*c* may cover the second pattern layer 101*b* and the fourth pattern layer 101*d* on the first pattern layer 101*a*. The third pattern layer 101*c* may extend into a space in which the second pattern layer 101*b* and the fourth pattern layer 101*d* are spaced apart, to contact the first pattern layer 101*a*. The third pattern layer 101*c* may include a semiconductor material, for example, polycrystalline silicon. In an example embodiment, the third pattern layer 101*c* may include an impurity region. A material of the third pattern layer 101*c* may not be limited to the semiconductor material, and may include a conductive material such as a metal material.

In an example embodiment, the memory cell structure CELL may further include a substrate insulating layer 109, disposed to be parallel to the second substrate 101, on the peripheral circuit structure PERI.

The stack structure GS may include interlayer insulating layers 120 and gate electrodes 130, alternately stacked on the second substrate 101. The stack structure GS may include a lower stack structure GS1 including first gate electrodes 130A and first interlayer insulating layers 120A, a connection insulating layer 125 on the lower stack structure GS1, and an upper stack structure GS2 disposed on the connection insulating layer 125 and including second gate electrodes 130B and second interlayer insulating layers 120B. In an example embodiment, the stack structure GS may be arranged in two stages, but the number of stages of the stack structure GS is not limited thereto, and may be variously changed to one or three or more stages.

The gate electrodes 130 may be stacked vertically spaced apart from each other on the first region R1, and may extend from the first region R1 to the second region R2 at different lengths to form a stepped structure. As illustrated in FIGS. 1 to 2B, the gate electrodes 130 may form a stepped structure between the gate electrodes 130 in the X-direction. In example embodiments, in at least a portion of the gate electrodes 130, a desired and/or alternatively predetermined number of, for example, two to six gate electrodes 130 may form a gate group, and a stepped structure may be formed between two gate groups in the X-direction. In this case, the gate electrodes 130 constituting the one gate group may be disposed to have a stepped structure in the Y-direction as well. Due to the stepped structure, the gate electrodes 130 may form a stepped shape in which lower gate electrodes 130 extend longer than upper gate electrodes 130.

As illustrated in FIG. 1, the gate electrodes 130 may be disposed to be separated from each other in the Y-direction by separation structures MS extending in the X-direction. Gate electrodes 130 between a pair of separation structures MS may form a memory block, but a scope of the memory block is not limited thereto.

The gate electrodes 130 may include a lower gate electrode 130L, memory gate electrodes 130W for forming a plurality of memory cells, and an upper gate electrode 130U. The memory gate electrodes 130W may be referred to as word lines. The number of memory gate electrodes 130W constituting the memory cells may be determined according to the data storage capacity of the semiconductor device 100. According to an embodiment, the number of each of the lower and upper gate electrodes 130L and 130U may be 1 to 4 or more, and the lower and upper gate electrodes 130L and 130U may have the same or different structure as the memory gate electrodes 130W. The lower and upper gate electrodes 130L and 130U may form a select transistor. At least a portion of the lower and upper gate electrodes 130L and 130U may form a Schottky barrier transistor. For example, at least a portion of the select transistors may be configured as the Schottky barrier transistor, to control flow of charges in a Schottky junction region adjacent to the lower and upper gate electrodes 130L and 130U. The lower and upper gate electrodes 130L and 130U may also be used in an erase operation by controlling flow of charges.

The gate electrodes 130 may include a metal material, for example, tungsten (W). According to embodiments, the gate electrodes 130 may include polycrystalline silicon or a metal silicide material. In example embodiments, the gate electrodes 130 may further include a diffusion barrier, and, for example, the diffusion barrier may include tungsten nitride (WN), tantalum nitride (TaN), titanium nitride (TiN), or a combination thereof. In an example embodiment, referring to FIGS. 3A and 4A, the gate electrodes 130 may include a gate conductive layer 131 including a conductive material such as the metal material or the like, and a gate dielectric layer 132 covering an upper surface and a lower surface of the gate conductive layer 131, respectively, and extending between the gate conductive layer 131 and the channel structure CH. The gate dielectric layer 132 may be disposed between the gate conductive layer 131 and the channel structure CH to cover a side surface of the gate conductive layer 131 facing the channel structure CH. The gate dielectric layer 132 may function as a portion of a blocking layer that limits and/or prevents charges in an information storage structure 142 from moving to the gate conductive layer 131. The gate dielectric layer 132 may include a metal oxide, for example, aluminum oxide. According to embodiments, the gate dielectric layer 132 may be omitted.

The interlayer insulating layers 120 may be alternately stacked with the gate electrodes 130 on the second substrate 101, and may form the stack structure GS together with the gate electrodes 130. Like the gate electrodes 130, the interlayer insulating layers 120 may be spaced apart from each other in a direction, perpendicular to an upper surface of the second substrate 101, and may be disposed to extend in the X-direction. The interlayer insulating layers 120 may include an insulating material such as silicon oxide or silicon nitride.

Contact structures 160 and 170 may include a contact plug 160 connected to the gate electrodes 130, and at least one support structure 170 disposed to pass through at least a portion of the stack structure GS in a region adjacent to the contact plug 160. The contact plug 160 may pass through a portion of a first upper insulating layer 191 from the top in the second region R2, and may be connected to upper surfaces of each of the gate electrodes 130 forming a stepped shape. The contact plug 160 may include a side surface having a hole shape and an inclined shape. The contact plug 160 may include a conductive material, for example, tungsten (W), copper (Cu), aluminum (Al), or the like. The support structure 170 may pass through the stack structure GS in the second region R2 to contact the second substrate 101. In an example embodiment, the support structure 170 may be provided as a plurality of support structures 170, and the plurality of support structures 170 may be arranged to surround the contact plug 160 in a plan view.

The peripheral contact plugs 173 and 174 may include a first peripheral contact plug 173 and a second peripheral contact plug 174. The first peripheral contact plug 173 may pass through the first upper insulating layer 191 to contact the second substrate 101. The first peripheral contact plug 173 may be spaced apart from the stack structure GS. The second peripheral contact plug 174 may pass through the first upper insulating layer 191, and may extend downwardly to contact the circuit wiring lines 50. The second peripheral contact plug 174 may be spaced apart from the stack structure GS.

The separation structures MS may pass through the gate electrodes 130, the interlayer insulating layers 120, the second pattern layer 101*b*, and the third pattern layer 101*c*, to be connected to the second substrate 101. In an example embodiment, the separation structures MS may extend into the first pattern layer 101*a* to contact the first pattern layer 101*a*, but inventive concepts are not limited thereto, and may be in contact with the upper surface of the first pattern layer 101*a*, or may be spaced apart from the first pattern layer 101*a*, without passing through the first pattern layer 101*a*. The separation structures MS may be respectively located in trenches extending in the X-direction. The separation structures MS may be disposed to be spaced apart from each other in the Y-direction. For example, the separation structures MS may separate the gate electrodes 130 from each other in the Y-direction. The separation structures MS may have a shape in which a width decreases toward the second substrate 101 due to a high aspect ratio, but shapes of the separation structures MS are not limited thereto. In addition, the separation structures MS may extend without bending, but inventive concepts are not limited thereto. The separation structures MS may include a metal material and/or an insulating material in the trenches. In an example embodiment, each of the separation structures MS may include a separation pattern, and spacers on side surfaces of the separation pattern. The separation pattern may include a conductive material, and the spacers may include an insulating material, for example, silicon oxide.

The upper separation structures SS may extend in the X-direction between the separation structures MS adjacent in the Y-direction. The upper separation structures SS may be disposed to pass through some of the gate electrodes 130U including an uppermost gate electrode 130 among the gate electrodes 130. As illustrated in FIGS. 1 and 2B, the upper separation structures SS may separate two gate electrodes 130 from each other in the Y-direction, but may be separated by the upper separation structures SS. The number of gate electrodes to be used may be variously changed in the embodiments. The number of gate electrodes 130 separated by the upper separation structures SS may be determined according to the number of string select lines. The upper separation structures SS may include an insulating material. The insulating material may include, for example, silicon oxide, silicon nitride, or silicon oxynitride.

The channel structure CH may pass through the stack structure GS including the gate electrodes 130 and the interlayer insulating layers 120. In an example embodiment, the channel structure CH may pass through the second and third pattern layers 101*b* and 101*c* to extend into the first pattern layer 101*a*. The channel structure CH may have a hole shape and a pillar shape, and may have an inclined side surface in which a width decreases toward the second substrate 101 according to an aspect ratio.

The channel structure CH may have a form in which lower and upper channel structures passing through the first and second stack structures GS1 and GS2 of the gate electrodes 130 are connected, and a region to be connected may have a bent portion by a difference or a change in width.

In an example embodiment, the channel structure CH may be provided as a plurality of channel structures CH, and each of the plurality of channel structures CH may form a memory cell string CSTR (refer to FIG. 8), and may be disposed on the second substrate 101 to be spaced apart from each other while forming rows and columns. The plurality of channel structures CH may be disposed to form a grid pattern in an XY plane, or may be disposed in a zigzag shape in one direction.

In an example embodiment, the semiconductor device 100 may further include a dummy channel structure having the same structure as the channel structure CH. In an example embodiment, the dummy channel structure may be provided as a plurality of dummy channel structures, and the plurality of dummy channel structures may be disposed on the second substrate 101 to be spaced apart from each other while forming rows and columns with the channel structures CH, and may be disposed, for example, in a region overlapping the upper separation structure SS. Arrangement and structures of the dummy channel structures are not limited thereto, and may be variously changed.

The upper insulating layers 191, 192, and 193 may be disposed to cover the stack structure GS and the channel structure CH. The upper insulating layers 191, 192, and 193 may be formed of an insulating material, and may include, for example, at least one of silicon oxide, silicon nitride, or silicon oxynitride. In an example embodiment, the upper insulating layers 191, 192, and 193 may include a first upper insulating layer 191, a second upper insulating layer 192, and a third upper insulating layer 193, sequentially stacked. The first upper insulating layer 191 may cover the stack structure GS, the second upper insulating layer 192 may cover the channel structures CH and the first upper insulating layer 191, and the third upper insulating layer 193 may cover the separation structures MS and the second upper insulating layer 192. The channel structure CH may pass through the first upper insulating layer 191, and an upper surface of the channel structure CH may be coplanar with a lower surface of the second upper insulating layer 192. The separation structures MS may pass through the second upper insulating layer 192, and upper surfaces of the separation structures MS may be coplanar with a lower surface of the third upper insulating layer 193.

In an example embodiment, the semiconductor device 100 may further include an upper wiring structure 180 including upper contact structures 182 and an upper wiring pattern 184. The upper contact structures 182 may pass through the second and third upper insulating layers 192 and 193 to be connected to the channel structure CH. The upper contact structures 182 may include a conductive material, for example, tungsten (W), copper (Cu), aluminum (Al), or the like. The upper wiring pattern 184 may be disposed on the third upper insulating layer 193, and may form an upper wiring structure electrically connected to the channel structure CH. The upper wiring pattern 184 may be bit lines BL. The upper wiring pattern 184 may include a conductive material, for example, tungsten (W), copper (Cu), aluminum (Al), or the like. In an example embodiment, the upper contact structures 182 and the upper wiring pattern 184 may include the same material, but inventive concepts are not limited thereto. In an example embodiment, the upper wiring pattern 184 and the upper contact structures 182 may be formed by different processes, but may be integrally formed according to embodiments.

FIGS. 3A to 3D are partially enlarged cross-sectional views illustrating various examples of a semiconductor device according to an example embodiment. FIGS. 3A to 3D are cross-sectional views illustrating a region corresponding to portion 'A' of FIG. 2B. FIGS. 4A to 4D are partially enlarged cross-sectional views illustrating various examples of a semiconductor device according to an example embodiment. FIGS. 4A to 4D are cross-sectional views illustrating a region corresponding to portion 'B' of FIG. 2B.

Figure 3A:
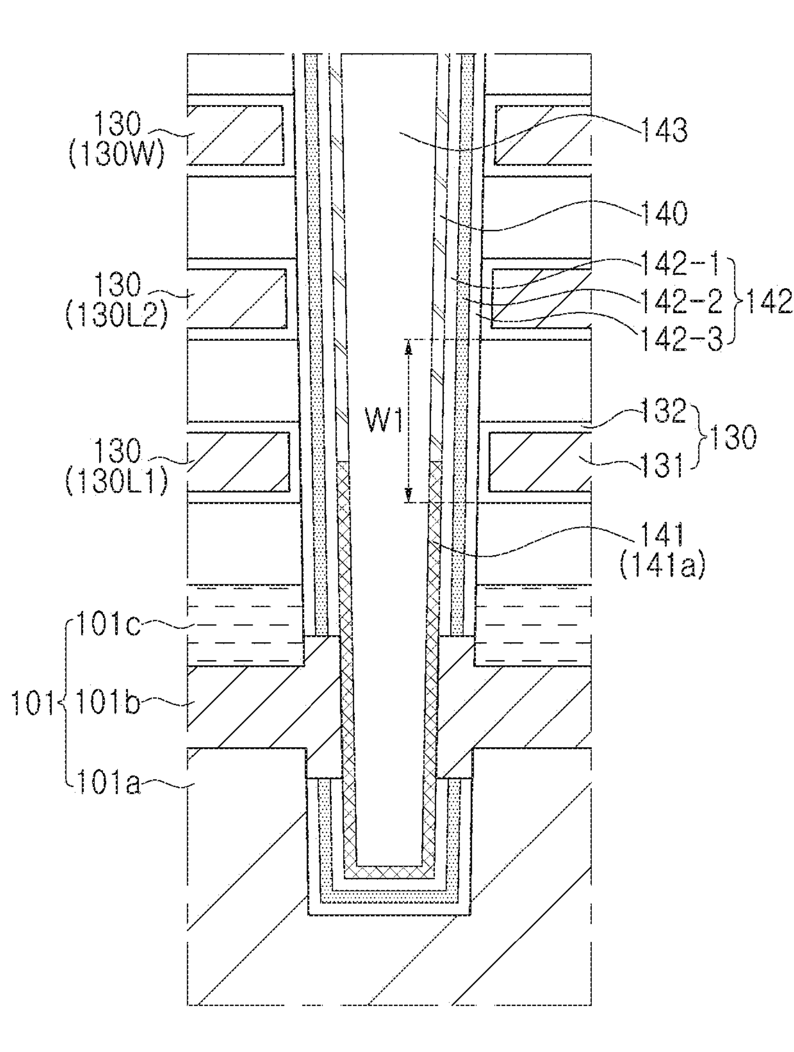
FIGS. 3A to 3D are partially enlarged cross-sectional views illustrating various examples of a semiconductor device according to some example embodiments.
Figure 4A:
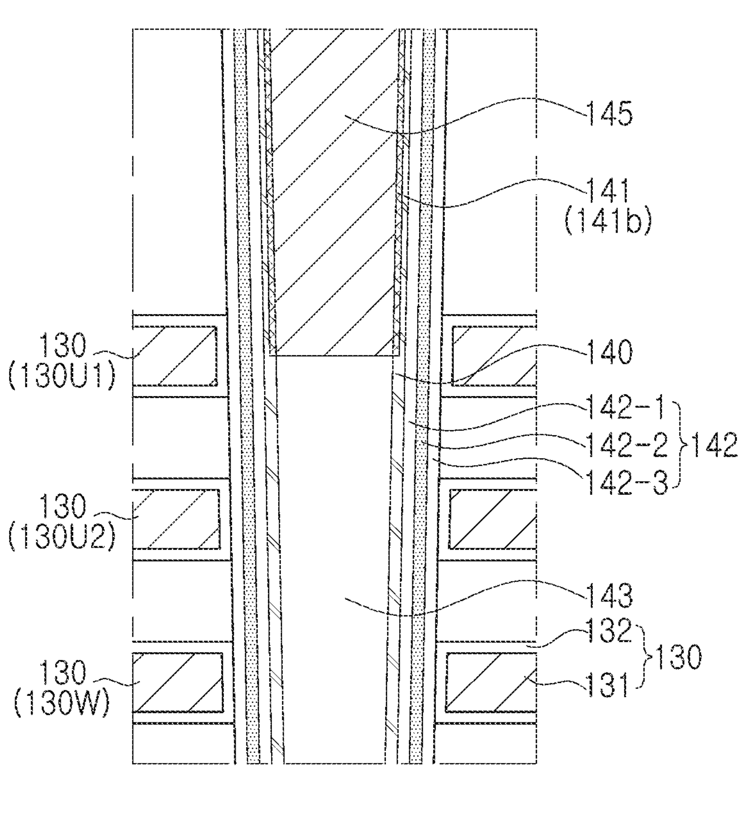
FIGS. 4A to 4D are partially enlarged cross-sectional views illustrating various examples of a semiconductor device according to some example embodiments.

Referring to FIGS. 2B, 3A, and 4A, in the semiconductor device 100 according to example embodiments, the channel structure CH may include a channel buried insulating layer 143, a channel layer 140, a metal-semiconductor compound layer 141, an information storage structure 142, and a conductive pad 145.

The channel buried insulating layer 143 may be an insulating layer disposed in a channel hole passing through the stack structure GS. According to embodiments, the channel buried insulating layer 143 may be omitted.

The channel layer 140 may surround at least a portion of the channel buried insulating layer 143 therein. The channel layer 140 may be in contact with the metal-semiconductor compound layer 141. The channel layer 140 may include a semiconductor material such as polycrystalline silicon or single crystal silicon, and the semiconductor material may be an undoped material or a material containing p-type or n-type impurities.

The metal-semiconductor compound layer 141 may surround a remaining portion of the channel buried insulating layer 143, not covered by the channel layer 140. The metal-semiconductor compound layer 141 may have an annular shape, together with the channel layer 140, to surround the channel buried insulating layer 143. When the channel buried insulating layer 143 is omitted, the channel layer 140 and the metal-semiconductor compound layer 141 may have a columnar shape such as a cylinder or a prism.

The information storage structure 142 may be disposed between the channel layer 140 and the gate electrodes 130. The information storage structure 142 may include a tunneling layer 142-1, an information storage layer 142-2, and a blocking layer 142-3, sequentially stacked on an outer side surface of the channel layer 140.

The tunneling layer 142-1 may tunnel a charge of the channel layer 140 to the information storage layer 142-2, and may include, for example, silicon oxide ($SiO_2$), silicon nitride ($Si_3N_4$), silicon oxynitride (SiON), or a combination thereof.

In an example embodiment, the information storage layer 142-2 may be a charge trap layer that traps and retains an electron injected from the channel layer 140 through the tunneling layer 142-1 according to operating conditions of a non-volatile memory device such as a flash memory device, or erases the trapped electron. The information storage layer 142-2 may include a semiconductor material, for example, silicon nitride.

The blocking layer 142-3 may be a layer for limiting and/or preventing a charge of the information storage layer 142-2 from moving to the gate electrodes 130. The blocking layer 142-3 may include silicon oxide ($SiO_2$), silicon nitride ($Si_3N_4$), silicon oxynitride (SiON), a high-k dielectric material, or a combination thereof.

The conductive pad 145 may be disposed on the channel buried insulating layer 143 in the channel structure CH. The conductive pad 145 may be disposed to cover an upper surface of the channel buried insulating layer 143 and to be electrically connected to the channel layer 140. The channel pad 145 may have a metal layer, and the metal layer may include at least one of a metal material, for example, tungsten (W), titanium (Ti), cobalt (Co), or nickel (Ni). As the conductive pad 145 is formed of the metal material, contact resistance with the upper wiring structure may be relatively reduced. Therefore, a semiconductor device having improved electrical performance may be provided.

In an example embodiment, the metal-semiconductor compound layer 141 may include a lower metal-semiconductor compound layer 141*a* contacting the second pattern layer 101*b*, and an upper metal-semiconductor compound layer 141*b* contacting the conductive pad 145.

The second pattern layer 101*b* may pass through the information storage structure 142 to contact the lower metal-semiconductor compound layer 141*a*. The second pattern layer 101*b* may extends between the first pattern layer 101*a* and the third pattern layer 101*c* in a direction of the channel structure CH, to cover a portion of a side surface of the first pattern layer 101*a* and a portion of a side surface of the third pattern layer 101*c*. Therefore, a thickness of the second pattern layer 101*b* between the first and third pattern layers 101*a* and 101*c* may be thinner than a thickness of the second pattern layer 101*b* in a region passing through the information storage structure 142. The lower metal-semiconductor compound layer 141*a* may extend from a region contacting the second pattern layer 101*b* in a direction toward the gate electrodes 130, to have an upper surface located on a higher level than an upper surface of the third pattern layer 101*c*.

Referring to FIG. 3A, the lower metal-semiconductor compound layer 141*a* may be in contact with the second pattern layer 101*b* and the channel layer 140. The lower metal-semiconductor compound layer 141*a* may be a compound layer including a metal element of the second pattern layer 101*b* and a semiconductor element of the channel layer 140. The lower metal-semiconductor compound layer 141*a* may be, for example, a silicide layer such as $WSi_2$, $TiSi_2$, $CoSi_2$, $NiSi_2$, or the like. According to embodiments, the second pattern layer 101*b* may include a metal material, different from the metal element of the lower metal-semiconductor compound layer 141*a*, or may include a double layer composed of the same metal material layer as the metal element of the lower metal-semiconductor compound layer 141*a*, and a separate metal material layer. Both side surfaces of the lower metal-semiconductor compound layer 141*a* may be coplanar with both side surfaces of the channel layer 140. a thickness of the lower metal-semiconductor compound layer 141*a* may be substantially equal to (or equal to) a thickness of the channel layer 140. Therefore, an upper surface of the lower metal-semiconductor compound layer 141*a* and a lower surface of the channel layer 140 may completely overlap in the Z-direction. According to embodiments, the lower metal-semiconductor compound layer 141*a* may be formed to have a relatively greater thickness.

The upper surface of the lower metal-semiconductor compound layer 141*a* contacting the channel layer 140 may be at least located on a level higher than a lower surface of a Schottky barrier control gate electrode 130L1 disposed in a lowermost portion of lower gate electrodes 130L1 and 130L2. For example, at least a portion of the lower metal-semiconductor compound layer 141*a* may overlap the Schottky barrier control gate electrode 130L1 in a direction, perpendicular to the Z-direction, for example, the Y-direction. The upper surface of the lower metal-semiconductor compound layer 141*a* may be located on a level lower than a lower surface of a ground select gate electrode 130L2, a lower gate electrode disposed on the Schottky barrier control gate electrode 130L1. Therefore, the upper surface of the lower metal-semiconductor compound layer 141*a* may be disposed in a first region W1, which may be a region on a level between a level of the lower surface of the Schottky barrier control gate electrode 130L1 and a level of the lower surface of the ground select gate electrode 130L2. A region in which the lower metal-semiconductor compound layer 141*a* and the channel layer 140 are in contact may form a Schottky junction region, to limit and/or prevent flow of current in both directions. The Schottky barrier control gate electrode 130L1 may control a Schottky barrier in the Schottky junction region to allow bidirectional flow of current. Therefore, a semiconductor device 100 having improved electrical performance may be provided by using the second pattern layer 101*b* as a metal material to improve and/or limit noise of the common source line and adjust the Schottky barrier in the Schottky junction region at the same time. In addition, a Schottky barrier transistor including the Schottky barrier control gate electrode 130L1 may control the Schottky barrier, to provide an electron during an ON operation and a hole during an erase operation. Therefore, the Schottky barrier control gate electrode 130L1 may be used as a gate electrode constituting an erase transistor used in the erase operation.

Referring to FIG. 4A, the upper metal-semiconductor compound layer 141*b* may be in contact with the conductive pad 145 and the channel layer 140. The upper metal-semiconductor compound layer 141*b* may be a compound layer including a metal element of the conductive pad 145 and a semiconductor element of the channel layer 140. According to embodiments, the conductive pad 145 may include a metal material, different from that of the upper metal-semiconductor compound layer 141*b*, or may include a double layer composed of a first metal material layer including the same metal material as the metal element of the upper metal-semiconductor compound layer 141*b* and a second metal material layer disposed on the first metal material layer and including a different metal material from the fist metal material layer. The upper metal-semiconductor compound layer 141*b* may be, for example, a silicide layer such as $WSi_2$, $TiSi_2$, $CoSi_2$, $NiSi_2$, or the like. The channel layer 140 may extend onto an outer side surface of the conductive pad 145, and the upper metal-semiconductor compound layer 141*b* may be disposed between the channel layer 140 and the conductive pad 145. For example, the upper metal-semiconductor compound layer 141*b* may be a layer that covers a side surface of the conductive pad 145 and extends in the Z-direction. A width of the channel layer 140 in a region contacting the upper metal-semiconductor compound layer 141*b* may be narrower than a width in a remaining region. Therefore, the channel layer 140 may have a bent portion within the region contacting the upper metal-semiconductor compound layer 141*b*.

A lower surface of the upper metal-semiconductor compound layer 141*b* may be located on substantially the same level as a lower surface of the conductive pad 145. The lower surface of the upper metal-semiconductor compound layer 141*b* may be at least located on a level lower than an upper surface of a Schottky barrier control gate electrode 130U1 disposed in an uppermost portion of upper gate electrodes 130U1 and 130U2. For example, at least a portion of the conductive pad 145 or at least a portion of the upper metal-semiconductor compound layer 141*b* may overlap the Schottky barrier control gate electrode 130U1 in a direction, perpendicular to the Z-direction, for example, the Y-direction. The lower surface of the upper metal-semiconductor compound layer 141*b* may be located on a level higher than an upper surface of a string select gate electrode 130U2, an upper select gate electrode disposed below the Schottky barrier control gate electrode 130U1. A region in which the upper metal-semiconductor compound layer 141*b* and the channel layer 140 are in contact may form a Schottky junction region, to limit and/or prevent flow of current in both directions. The Schottky barrier control gate electrode 130U1 may control a Schottky barrier in the Schottky junction region to allow bidirectional flow of current. Therefore, a semiconductor device 100 having improved electrical performance may be provided by using the conductive pad 145 as a metal material to reduce contact resistance between the conductive pad 145 and the upper wiring structure 180 and adjust the Schottky barrier in the Schottky junction region at the same time. In addition, as a thickness of the upper metal-semiconductor compound layer 141*b* is relatively thin to increase a contact area with the channel layer 140, control of the Schottky barrier by the Schottky barrier control gate electrode 130U1 may be easily controlled.

Figure 3B:
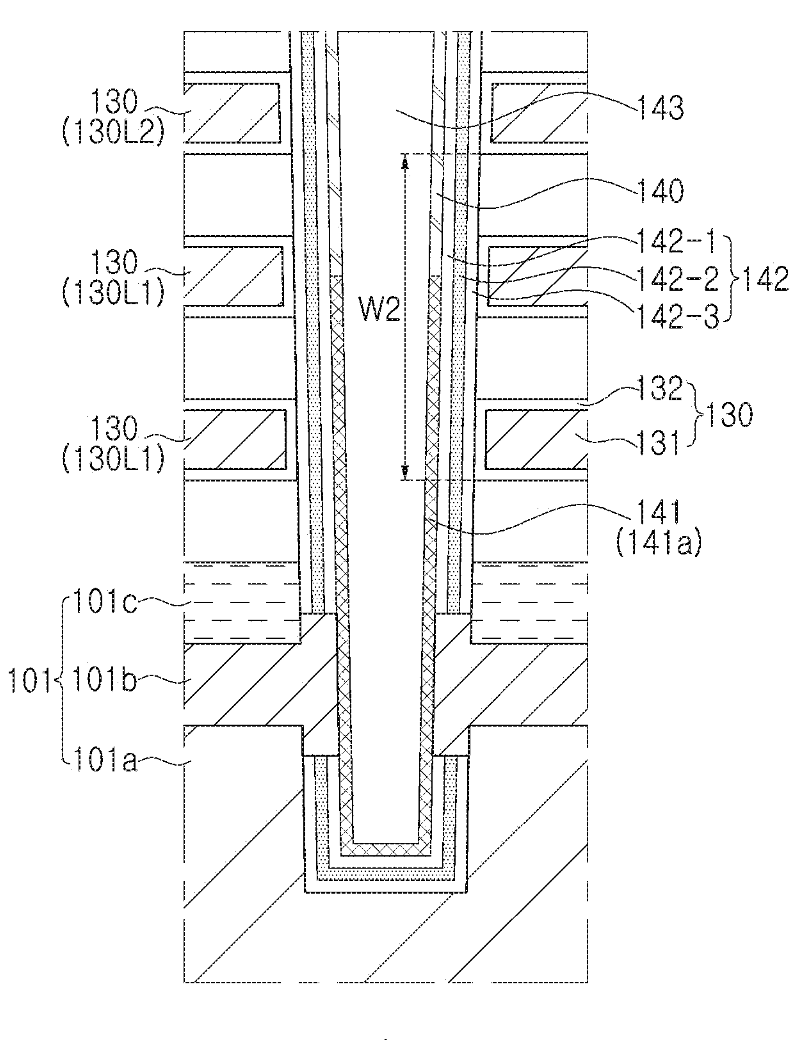

FIG. 3B is a partially enlarged cross-sectional view illustrating a semiconductor device 100*a* according to example embodiments.

Referring to FIG. 3B, among lower gate electrodes 130L1 and 130L2, there may be a plurality of Schottky barrier control gate electrodes 130L1. In an example embodiment, the plurality of Schottky barrier control gate electrodes 130L1 may be two gate electrodes disposed in a lower portion, but the number of Schottky barrier control gate electrodes is not limited thereto. As the number of Schottky barrier control gate electrodes increases, a semiconductor device 100*a* having improved electrical performance may be provided by efficiently controlling a Schottky barrier during an ON operation and/or an erase operation. In addition, an upper surface of a lower metal-semiconductor compound layer 141*a* contacting a channel layer 140 may be disposed in a second region W2, which may be a region on a level between a level of a lower surface of a gate electrode disposed in a lowermost portion of the plurality of Schottky barrier control gate electrodes 130L1 and a level of a lower surface of the ground select gate electrode 130L2, which may be a lower gate electrode among the plurality of Schottky barrier control gate electrodes 130L1. As the second region W2 has a width, wider than a width of the first region W1 of FIG. 3A, difficulty of manufacturing a metal-semiconductor compound layer may be improved.

Figure 3C:
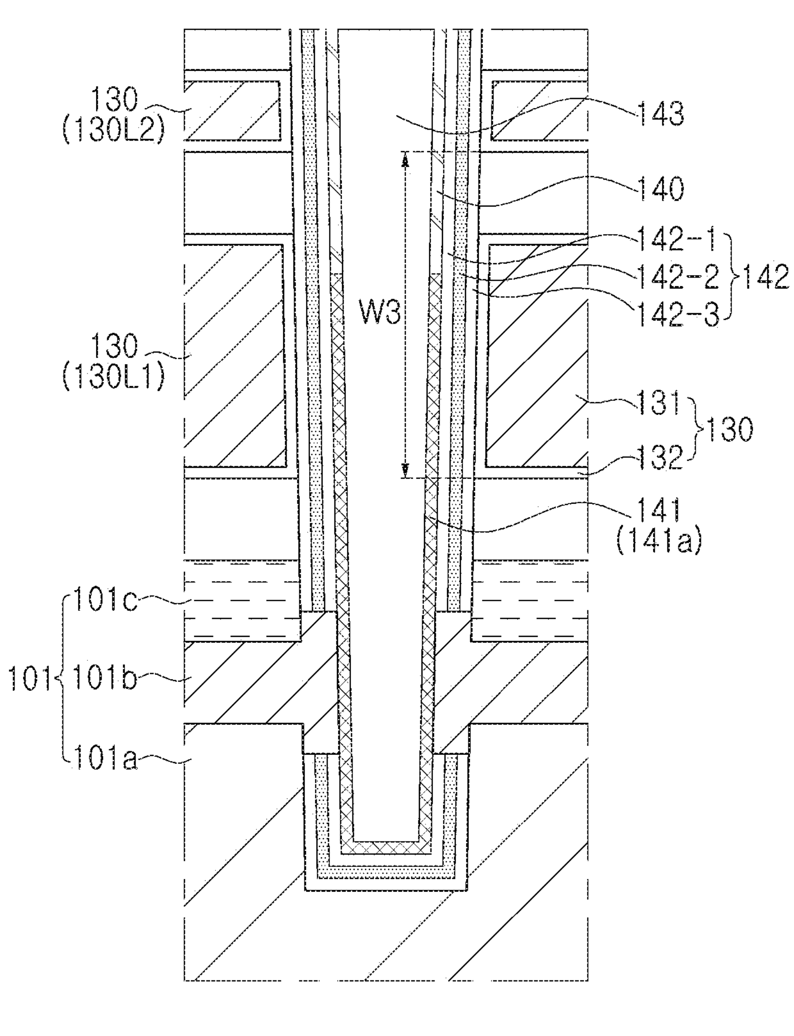

FIG. 3C is a partially enlarged cross-sectional view illustrating a semiconductor device 100*b* according to example embodiments.

Referring to FIG. 3C, among lower gate electrodes 130L1 and 130L2, a thickness of a Schottky barrier control gate electrode 130L1 may be thicker than a thickness of a remaining gate electrode 130. An upper surface of the lower metal-semiconductor compound layer 141*a* may be disposed in a third region W3, which may be a region on a level between a level of a lower surface of the Schottky barrier control gate electrode 130L1 and a level of a lower surface of a ground select gate electrode 130L2. As the thickness of the Schottky barrier control gate electrode 130L1 relatively increases, a width of the third region W3 may be wider than a width of the first region W1 of FIG. 3A. Therefore, difficulty of manufacturing a metal-semiconductor compound layer may be improved.

Figure 3D:
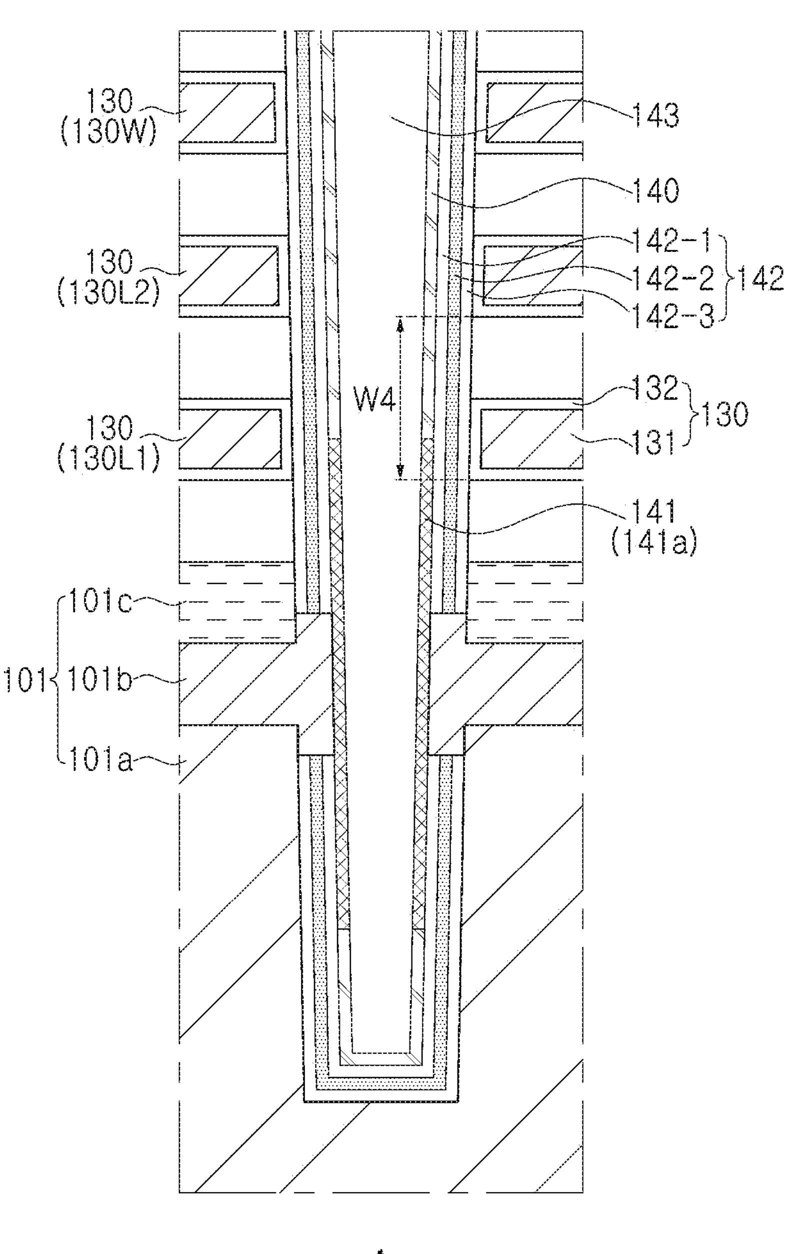

FIG. 3D is a partially enlarged cross-sectional view illustrating a semiconductor device 100*c* according to example embodiments.

Referring to FIG. 3D, a channel structure CH of a semiconductor device 100*c* may be formed to extend deeper into a first channel layer 101*a*, compared to the embodiment of FIG. 3A.

A lower metal-semiconductor compound layer 141*a* may be a layer in which a portion of a channel layer 140 is replaced in a silicide process or the like. The lower metal-semiconductor compound layer 141*a* may extend in an upward direction toward a stack structure GS and a downward direction toward the first pattern layer 101*a*, from a region contacting a second pattern layer 101*b*, by substantially the same depth. As the channel structure CH extends to a relatively deep depth, the lower metal-semiconductor compound layer 141*a* may not completely replace a lower region of the channel layer 140 in the silicide process or the like. Therefore, a portion of the channel layer 140 may remain below the lower metal-semiconductor compound layer 141*a*.

Figure 4B:
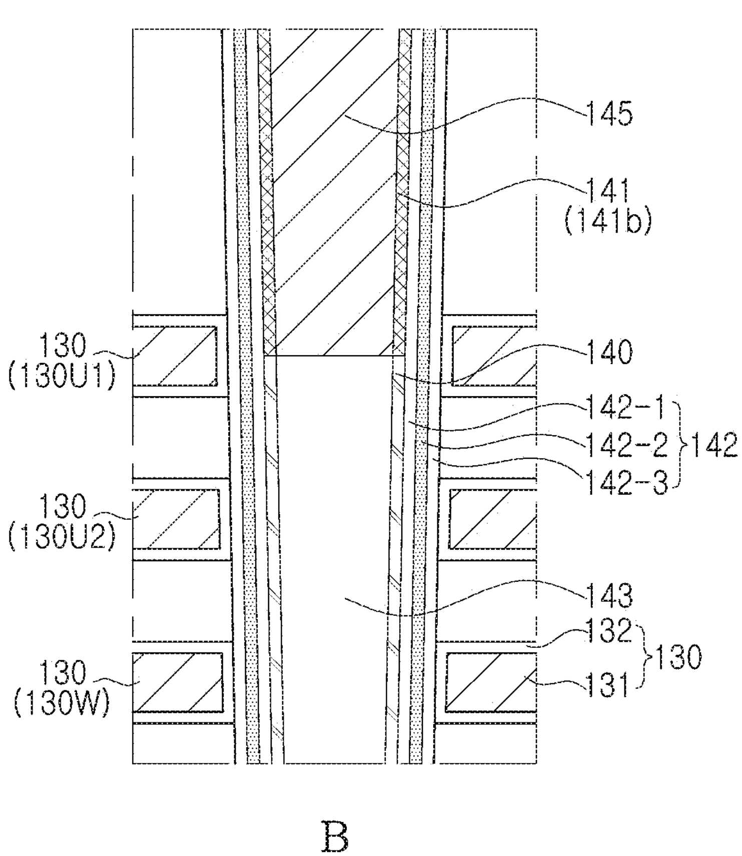

FIG. 4B is a partially enlarged cross-sectional view illustrating a semiconductor device 100*d* according to example embodiments.

Referring to FIG. 4B, in a semiconductor device 100*d*, an upper metal-semiconductor compound layer 141*b* may be in contact with a conductive pad 145 and a channel layer 140. The upper metal-semiconductor compound layer 141*b* may be, for example, a silicide layer such as $WSi_2$, $TiSi_2$, $CoSi_2$, $NiSi_2$, or the like. The channel layer 140 may be in contact with a lower surface of the upper metal-semiconductor compound layer 141*b* without extending onto an outer side surface of the conductive pad 145. The upper metal-semiconductor compound layer 141*b* may be disposed between an information storage structure 142 and the conductive pad 145. The upper metal-semiconductor compound layer 141*b* may have substantially the same thickness as the channel layer 140, and may overlap the channel layer 140 in the Z-direction. In an example embodiment, the lower surface of the upper metal-semiconductor compound layer 141*b* may be located on substantially the same level as a lower surface of the conductive pad 145, but inventive concepts are not limited thereto, and may be located on a lower level than the lower surface of the conductive pad 145. The lower surface of the upper metal-semiconductor compound layer 141*b* may be located on a level lower than an upper surface of a Schottky barrier control gate electrode 130U1 disposed in an uppermost portion of upper gate electrodes 130U1 and 130U2. For example, at least a portion of the conductive pad 145 or at least a portion of the upper metal-semiconductor compound layer 141*b* may overlap the Schottky barrier control gate electrode 130U1 in a direction, perpendicular to the Z-direction, for example, the Y-direction. This may be a structure generated by a relatively increased portion of the channel layer 140 substituted with the upper metal-semiconductor compound layer 141*b*, as compared to FIG. 4A.

Figure 4C:
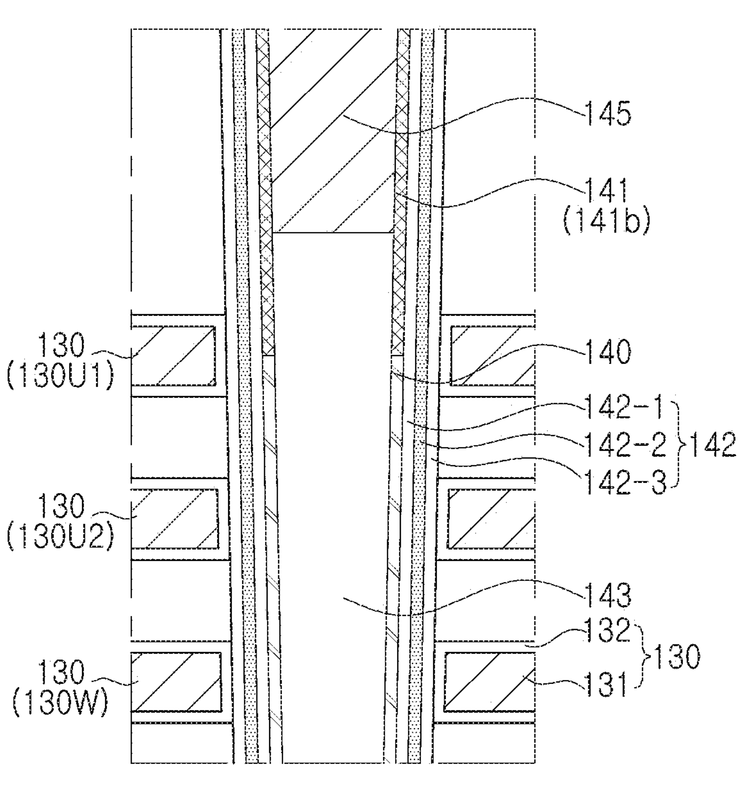

FIG. 4C is a partially enlarged cross-sectional view illustrating a semiconductor device 100*e* according to example embodiments.

Referring to FIG. 4C, in a semiconductor device 100*e*, a lower surface of an upper metal-semiconductor compound layer 141*b* may be located on a lower level than a lower surface of a conductive pad 145. At least a portion of the upper metal-semiconductor compound layer 141*b* may overlap a Schottky barrier control gate electrode 130U1 in a direction, perpendicular to the Z-direction, for example, the Y-direction, and the conductive pad 145 may not overlap the Schottky barrier control gate electrode 130U1 in a direction, perpendicular to the Z-direction, for example, the Y-direction. This may be a structure in which the lower surface of the conductive pad 145 may be disposed on a relatively high level, compared to FIG. 4A, and a portion of a channel layer 140 substituted with the metal-semiconductor compound layer 141*b* relatively increases.

Figure 4D:
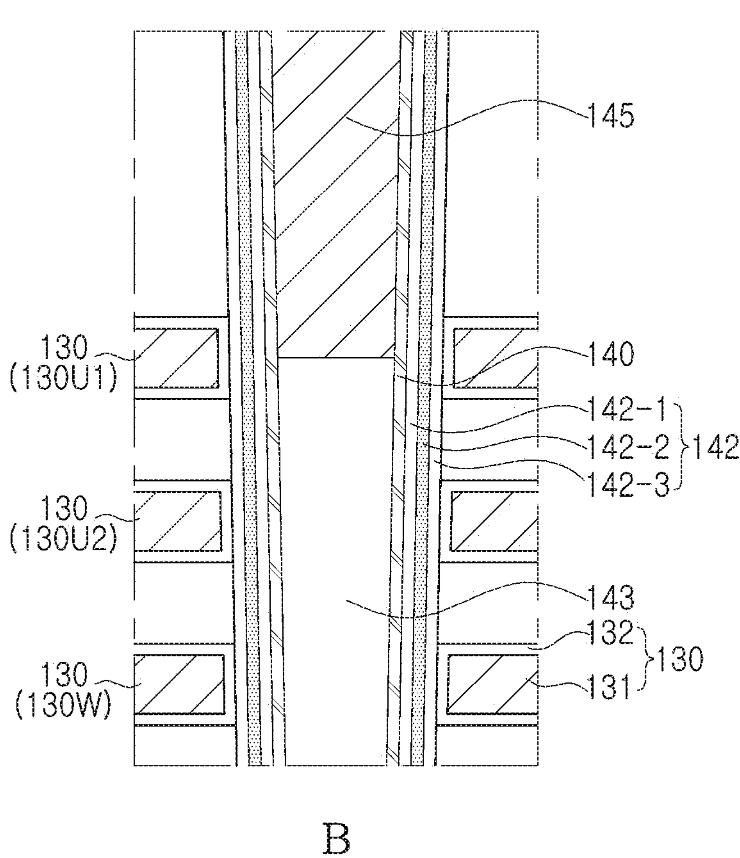

FIG. 4D is a partially enlarged cross-sectional view illustrating a semiconductor device 100*f* according to example embodiments.

Referring to FIG. 4D, unlike in FIG. 4A, an upper metal-semiconductor compound layer 141*b* may be omitted. Therefore, a separate layer may not be interposed between a conductive pad 145 having a metal layer and a channel layer 140. In this case, a region in which the conductive pad 145 and the channel layer 140 are in contact may form a Schottky junction region, to limit and/or prevent flow of current. At least a portion of the region in which the conductive pad 145 and the channel layer 140 are in contact may overlap a Schottky barrier control gate electrode 130U1 in a direction, perpendicular to the Z-direction, for example, the Y-direction. The Schottky barrier control gate electrode 130U1 may adjust a Schottky barrier to control flow of current in both directions.

Figure 5A:
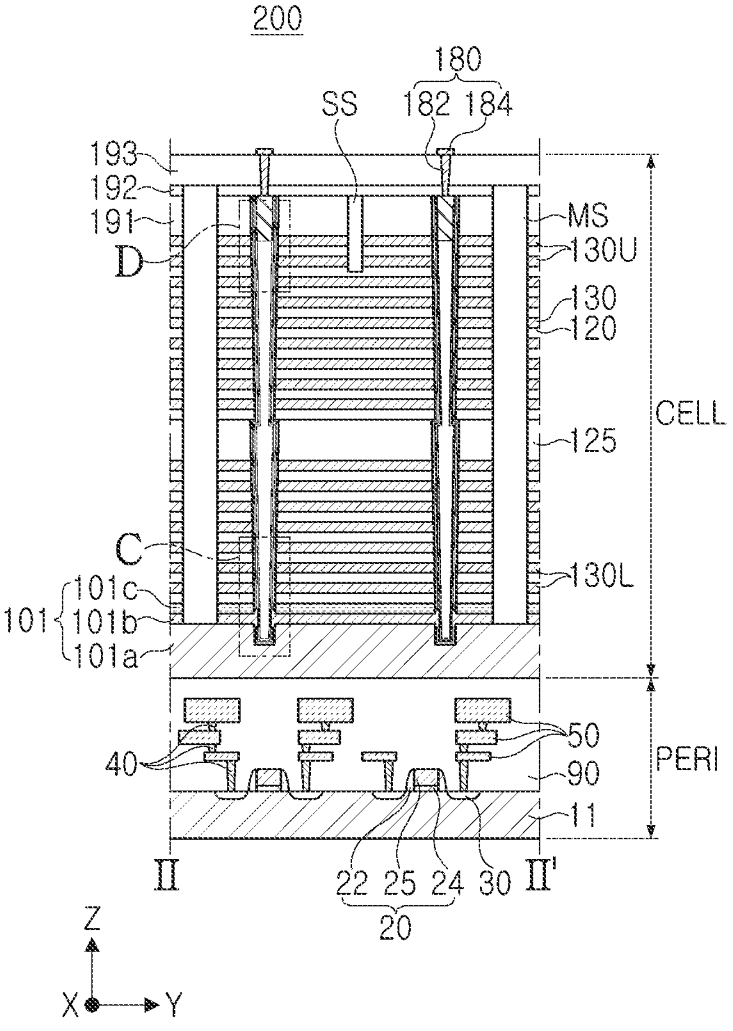
FIGS. 5A and 5B are cross-sectional views illustrating a semiconductor device according to an example embodiment, and partially enlarged cross-sectional views thereof.
Figure 5B:
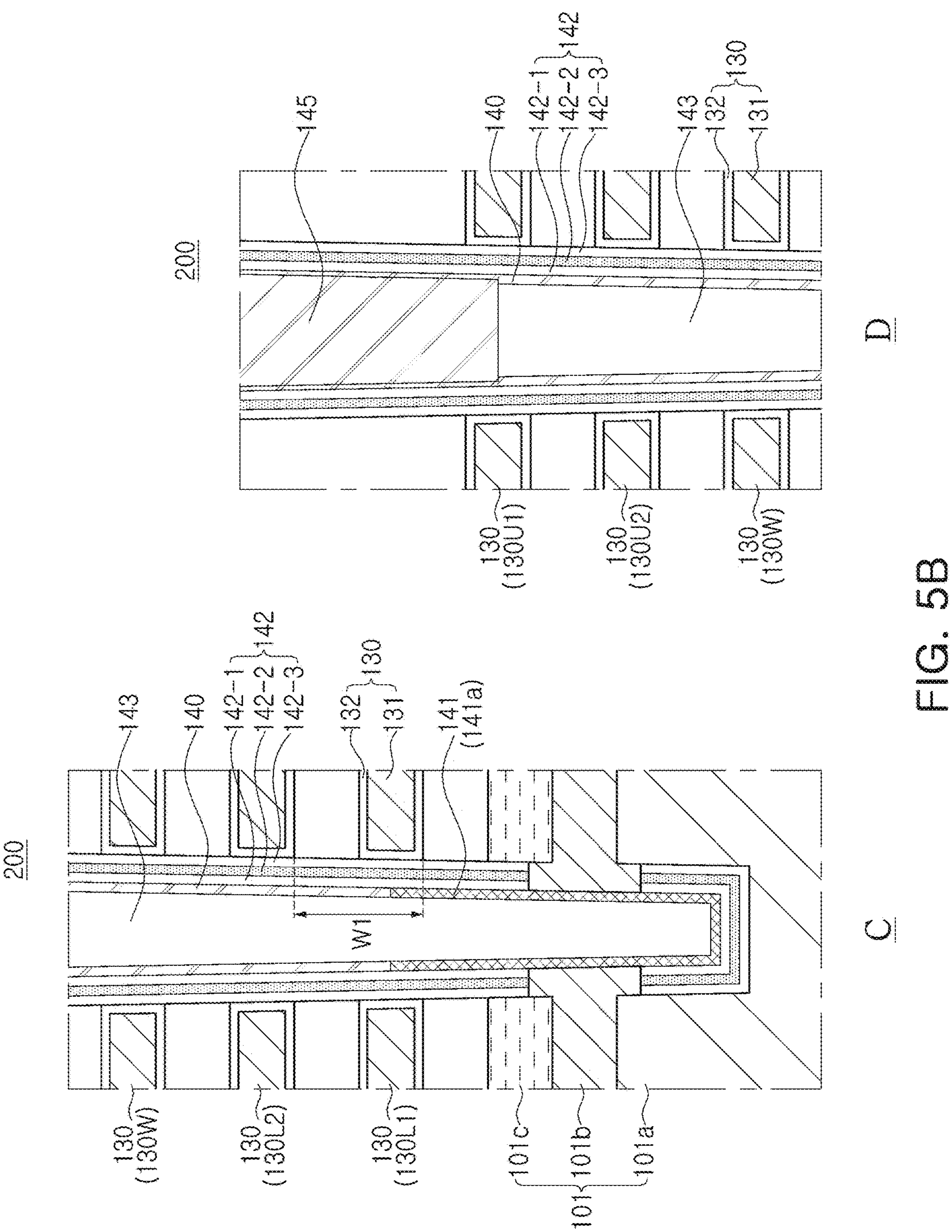

FIGS. 5A and 5B are cross-sectional views illustrating a semiconductor device 200 according to an example embodiment, and partially enlarged cross-sectional views thereof. FIG. 5A illustrates a region corresponding to a cross-section of FIG. 1, taken along line II-II', and FIG. 5B illustrates portion 'C' and portion 'D' of FIG. 5A together.

Referring to FIGS. 5A and 5B, a semiconductor device 200 may have a channel structure CH, different from that of FIGS. 1 to 3A and 4A. Hereinafter, overlapping descriptions thereof will be omitted.

Referring to FIG. 5B, a second pattern layer 101*b* has a metal layer, as in FIG. 3A, and the metal layer may include at least one of tungsten (W), titanium (Ti), cobalt (Co), or nickel (Ni). In addition, a lower metal-semiconductor compound layer 141*a* may be in contact with a channel layer 140 and the second pattern layer 101*b*, and may extend in a direction of gate electrodes 130, such that at least a portion thereof overlaps a lowermost Schottky barrier control gate electrode 130L1 among lower gate electrodes 130L1 and 130L2.

Referring to FIG. 5B, a conductive pad 145 may include a semiconductor material, for example, polycrystalline silicon, without a metal layer, unlike FIG. 4A. The channel structure CH may not include the upper metal-semiconductor compound layer 141*b* of FIG. 4A. The channel layer 140 may extend in the Z-direction while covering an outer side surface of the conductive pad 145. In an example embodiment, a thickness of the channel layer 140 in a region contacting the conductive pad 145 may be thinner than a thickness in a remaining region, and the channel layer 140 may have a bent portion within the region contacting the conductive pad 145. According to embodiments, the channel layer 140 may not have a bent portion, may have a substantially constant thickness, and may cover the outer side surface of the conductive pad 145. Also, according to embodiments, the channel layer 140 may not cover the outer side surface of the conductive pad 145, and may be in contact with a lower surface of the conductive pad 145. In an example embodiment, unlike FIG. 4A, an upper gate electrode 130U1 disposed in an uppermost portion may not be a Schottky barrier control gate electrode, but may form an erase transistor used to perform an erase operation using a gate induced drain leakage (GIDL) phenomenon.

Figure 6A:
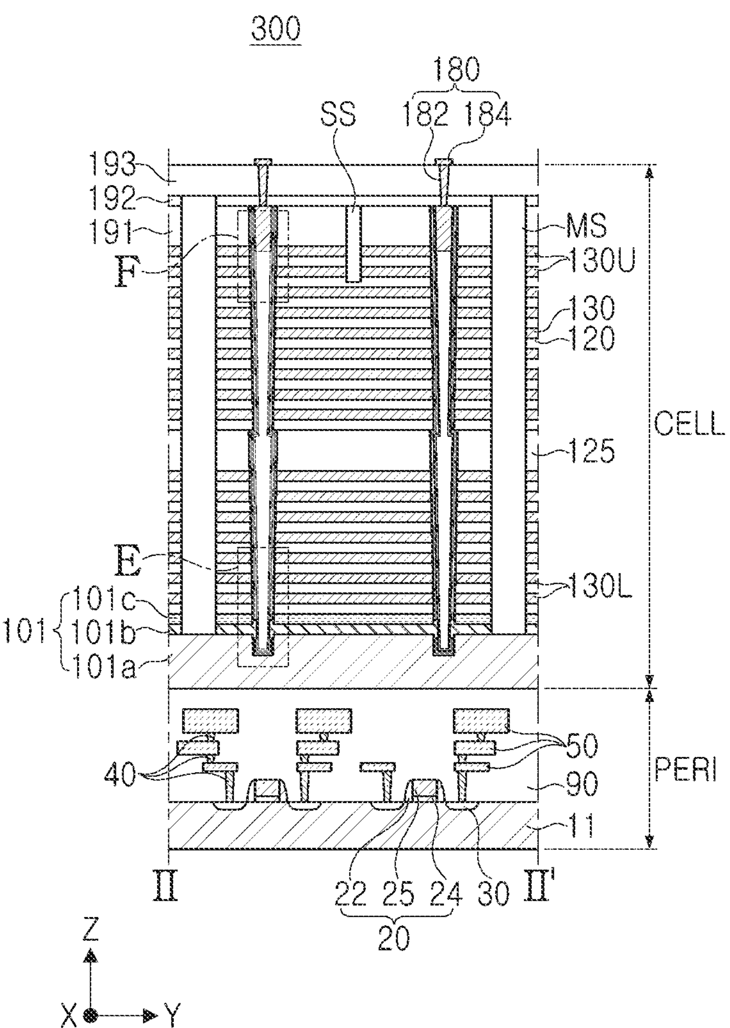
FIGS. 6A and 6B are cross-sectional views illustrating a semiconductor device according to an example embodiment, and partially enlarged cross-sectional views thereof.
Figure 6B:
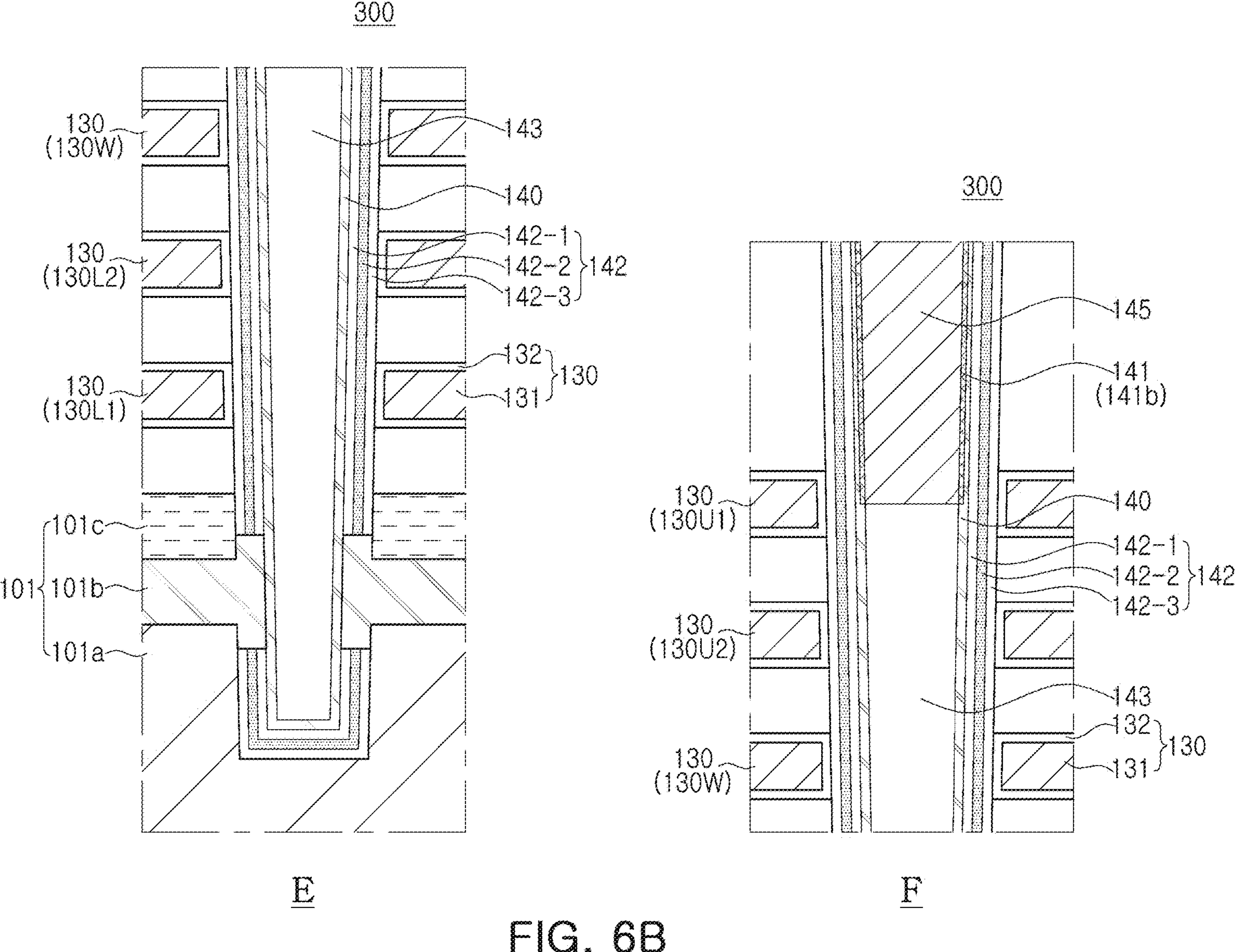

FIGS. 6A and 6B are cross-sectional views illustrating a semiconductor device 300 according to an example embodiment, and partially enlarged cross-sectional views thereof. FIG. 6A illustrates a region corresponding to a cross-section of FIG. 1, taken along line II-II', and FIG. 6B illustrates portion 'E' and portion 'F' of FIG. 6A together.

Referring to 6A and 6B, the semiconductor device 300 may have a channel structure CH and a second pattern layer 101*b*, different from those of FIGS. 1 to 3A and 4A. Hereinafter, overlapping descriptions thereof will be omitted.

Referring to FIG. 6B, the second pattern layer 101*b* may not have a metal layer, unlike in FIG. 3A. The second pattern layer 101*b* may include a semiconductor material, for example, polycrystalline silicon. The channel structure CH may not include the lower metal-semiconductor compound layer 141*a* of FIG. 3A. A channel layer 140 may be in contact with the second pattern layer 101*b*. The channel layer 140 may extend along a coplanar surface of the second pattern layer 101*b* and an information storage structure 142. In an example embodiment, unlike FIG. 3A, a lower gate electrode 130L1 disposed in a lowermost portion may not be a Schottky barrier control gate electrode, but may form an erase transistor used to perform an erase operation using a gate induced drain leakage (GIDL) phenomenon.

Referring to FIG. 6B, a conductive pad 145 and an upper metal-semiconductor compound layer 141*b* may have the same structure as those of FIG. 4A. For example, the conductive pad 145 has a metal layer, and the metal layer may include at least one of tungsten (W), titanium (Ti), cobalt (Co), or nickel (Ni). The upper metal-semiconductor compound layer 141*b* may be in contact with the conductive pad 145 and the channel layer 140, and may extend in a direction of gate electrodes 130 to at least partially overlap a Schottky barrier control gate electrode 130U1 among upper gate electrodes 130U1 and 130U2.

Figure 7:
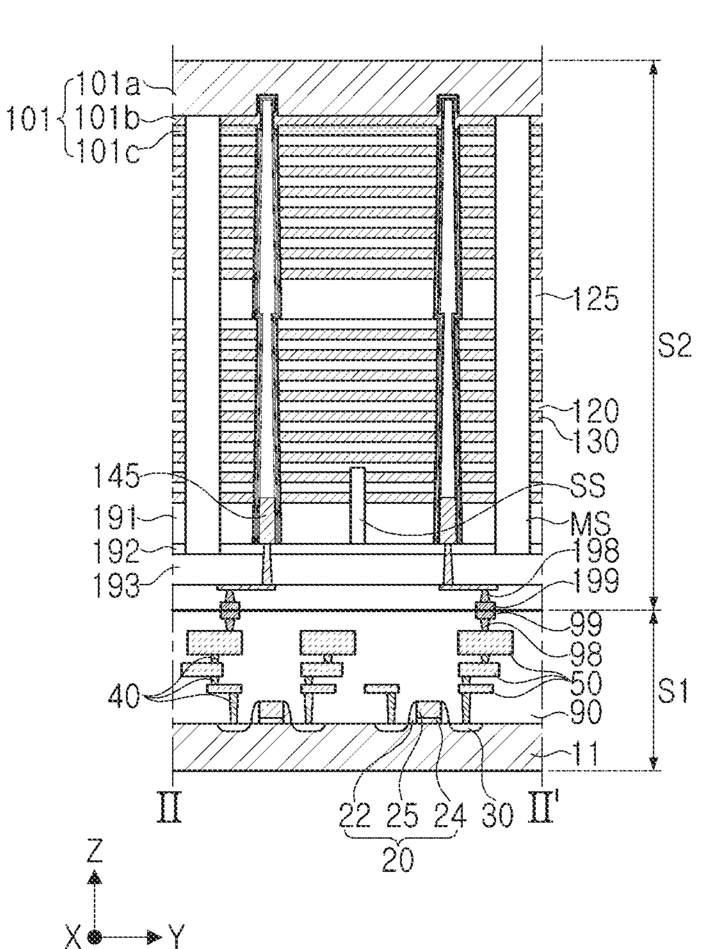
FIG. 7 is a cross-sectional view illustrating a semiconductor device according to an example embodiment.

FIG. 7 is a cross-sectional view illustrating a semiconductor device 400 according to example embodiments. FIG. 7 illustrates a region of a semiconductor device 400 corresponding to a cross-section of FIG. 1, taken along line II-II'.

Referring to FIG. 7, a semiconductor device 400 may include a first structure S1 and a second structure S2, bonded by a wafer bonding method.

The description of the peripheral circuit region PERI described above with reference to FIGS. 1 to 2B may be applied to the first structure S1. The first structure S1 may further include first bonding vias 98 and first bonding pads 99, which may be bonding structures.

The first bonding vias 98 may be disposed on an uppermost circuit wiring line 50 among circuit wiring lines 50, to be connected to the circuit wiring lines 50. At least a portion of the first bonding pads 99 may be on the first bonding vias 98 and connected to the first bonding vias 98. The first bonding pads 99 may be connected to second bonding pads 199 of the second structure S2. The first bonding pads 99 may provide an electrical connection path according to the bonding of the first structure S1 and the second structure S2, together with the second bonding pads 199. The first bonding vias 98 and the first bonding pads 99 may include a conductive material, for example, copper (Cu).

The descriptions with reference to FIGS. 1 to 4D may be equally applied to the second structure S2, unless otherwise specified. The second structure S2 may further include second bonding vias 198 and second bonding pads 199, which may be bonding structures. The second structure S2 may further include a protective layer covering the upper surface of the second substrate 101.

The second bonding vias 198 and the second bonding pads 199 may be disposed below wiring lines in a lowermost portion. The second bonding vias 198 may be connected to the wiring lines and the second bonding pads 199, and the second bonding pads 199 may be bonded to the first bonding pads 99 of the first structure S1. In the present specification, an upper wiring pattern is illustrated to be directly connected to the second bonding vias 198. According to some embodiments, lower wirings disposed below the upper wiring pattern, and contact plugs connecting the upper wiring pattern and the lower wirings may be further included, and the second bonding vias 198 may be connected to the lower wirings. The second bonding vias 198 and the second bonding pads 199 may include a conductive material, for example, copper (Cu).

The first structure Si and the second structure S2 may be bonded in a copper (Cu)-copper (Cu) bonding manner by the first bonding pads 99 and the second bonding pads 199. In addition to the copper (Cu)-copper (Cu) bonding manner, the first structure S1 and the second structure S2 may be additionally bonded by a dielectric-dielectric bonding manner. The dielectric-dielectric bonding manner may form a portion of a peripheral region insulating layer 90 and a portion of respective upper insulating layers 191, 192, and 193, and may be bonding by dielectric layers surrounding each of the first bonding pads 99 and the second bonding pads 199. Therefore, the first structure S1 and the second structure S2 may be bonded without a separate adhesive layer.

Figure 8:
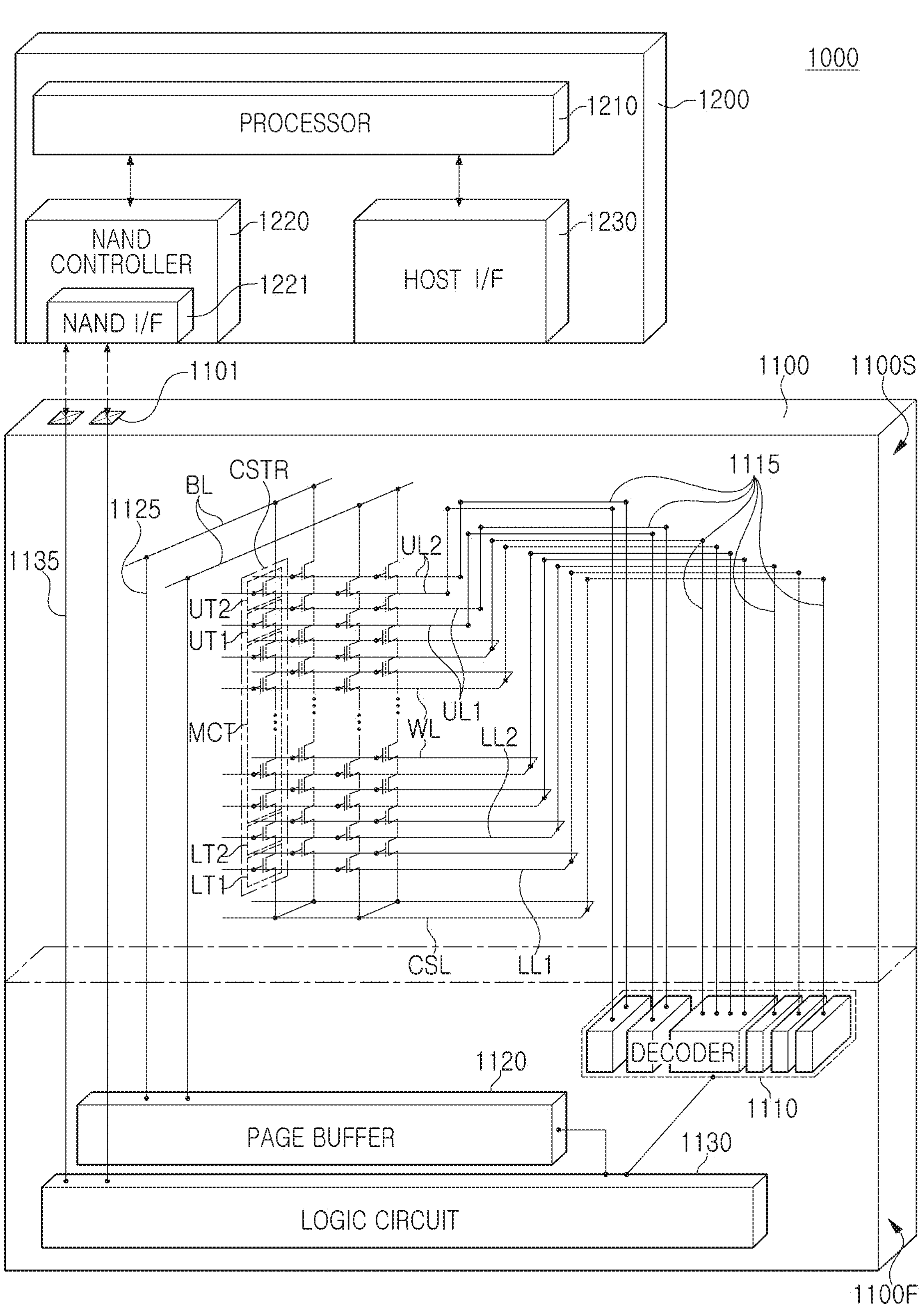
FIG. 8 is a view schematically illustrating a data storage system including a semiconductor device according to an example embodiment.

FIG. 8 is a view schematically illustrating a data storage system 1000 including a semiconductor device according to an example embodiment.

Referring to FIG. 8, a data storage system 1000 may include a semiconductor device 1100, and a controller 1200 electrically connected to the semiconductor device 1100 and controlling the semiconductor device 1100. The data storage system 1000 may be a storage device including one or a plurality of semiconductor devices 1100, or an electronic device including the storage device. For example, the data storage system 1000 may be a solid state drive device (SSD), a universal serial bus (USB), a computing system, a medical device, or a communication device, including the one or the plurality of semiconductor devices 1100.

The semiconductor device 1100 may be a non-volatile memory device, for example, the NAND flash memory device described above with reference to FIGS. 1 to 7. The semiconductor device 1100 may include a first semiconductor structure 1100F, and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including bit lines BL, a common source line CSL, word lines WL, first and second upper gate lines UL1 and UL2, first and second lower gate lines LL1 and LL2, and memory cell strings CSTR between the bit lines BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed according to embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first semiconductor structure 1100F into the second semiconductor structure 1100S. The bit lines BL may be electrically connected to the page buffer 1120 through second connection wirings 1125 extending from the first semiconductor structure 1100F into the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first semiconductor structure 1100F into the second semiconductor structure 1100S.

The processor 1210 may control an overall operation of the data storage system 1000 including the controller 1200. The processor 1210 may operate according to a desired and/or alternatively predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 9:
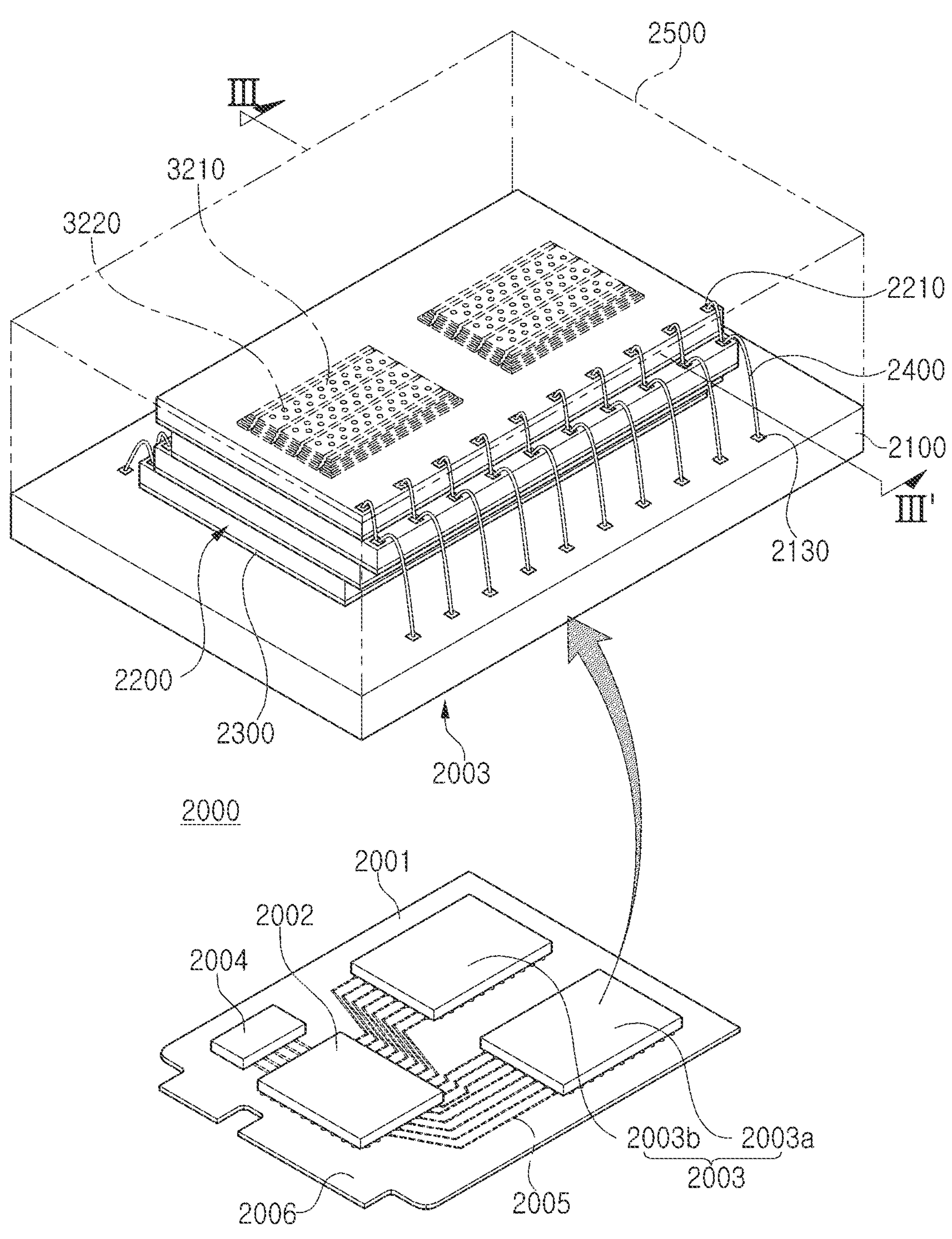
FIG. 9 is a perspective view schematically illustrating a data storage system including a semiconductor device according to an example embodiment.

FIG. 9 is a perspective view schematically illustrating a data storage system including a semiconductor device according to an example embodiment.

Referring to FIG. 9, a data storage system 2000 according to an example embodiment of inventive concepts may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component wiring express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003*a* and 2003*b*, spaced apart from each other. Each of the first and second semiconductor packages 2003*a* and 2003*b* may be a semiconductor package including a plurality of semiconductor chips 2200. Each of the semiconductor chips 2200 may include the semiconductor device according to any one of the embodiments described above with reference to FIGS. 1 to 7.

Each of the first and second semiconductor packages 2003*a* and 2003*b* may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 8. Each of the semiconductor chips 2200 may include gate mold structures 3210 and channel structures 3220. Each of the semiconductor chips 2200 may include the semiconductor device described above with reference to FIGS. 1 to 7.

In example embodiments, the connection structure 2400 may be a bonding wire electrically connecting the input/output pad 2210 and the package upper pads 2130. Therefore, in each of the first and second semiconductor packages 2003*a* and 2003*b*, the semiconductor chips 2200 may be electrically connected to each other by a bonding wire process, and may be electrically connected to the package upper pads 2130 of the package substrate 2100. According to embodiments, in each of the first and second semiconductor packages 2003*a* and 2003*b*, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 10:
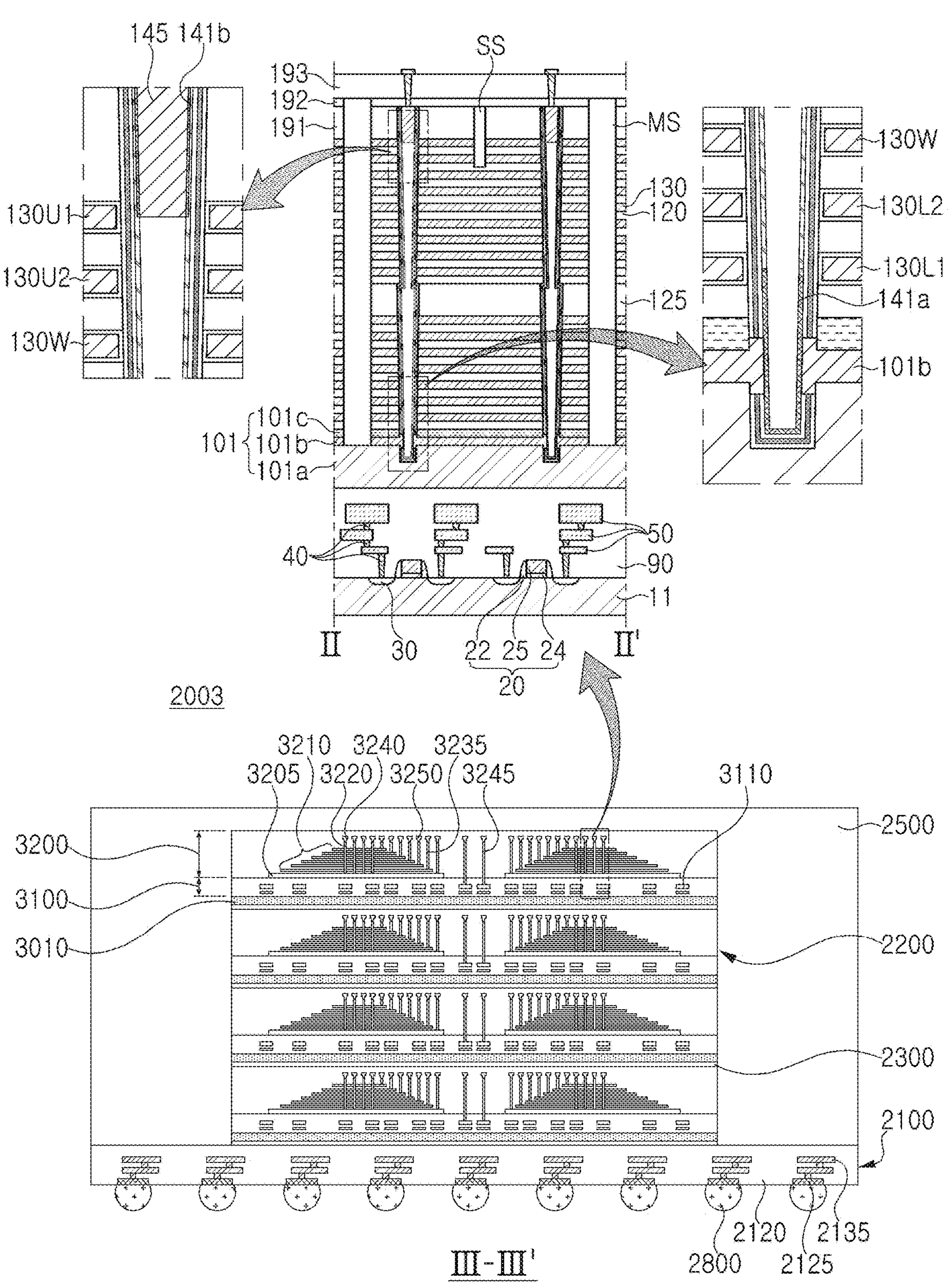
FIG. 10 is a cross-sectional view schematically illustrating a semiconductor package according to an example embodiment.

FIG. 10 is a cross-sectional view schematically illustrating a semiconductor package according to an example embodiment. FIG. 10 illustrates an example embodiment of the semiconductor package 2003 of FIG. 9, and conceptually illustrates a region taken along line II-II' of the semiconductor package 2003 of FIG. 9.

Referring to FIG. 10, in the semiconductor package 2003, the package substrate 2100 may be a printed circuit board. The package substrate 2100 may include a package substrate body portion 2120, package upper pads 2130 disposed on an upper surface of the package substrate body portion 2120 (see FIG. 9), package lower pads 2125 disposed on a lower surface of the package substrate body portion 2120 or exposed from the lower surface, and internal wirings 2135 electrically connecting the package upper pads 2130 and the package lower pads 2125 in the package substrate body portion 2120. The package upper pads 2130 may be electrically connected to the connection structures 2400. The package lower pads 2125 may be connected to the wiring patterns 2005 of the main substrate 2001 of the data storage system 2000, as illustrated in FIG. 9, through conductive connection portions 2800.

Each of the semiconductor chips 2200 may include a semiconductor substrate 3010, and a first semiconductor structure 3100 and a second semiconductor structure 3200, sequentially stacked on the semiconductor substrate 3010. The first semiconductor structure 3100 may include a peripheral circuit region including peripheral wirings 3110. The second semiconductor structure 3200 may include a common source line 3205, a gate stack structure 3210 on the common source line 3205, memory channel structures 3220 and separation regions 3230, passing through the gate stack structure 3210, bit lines 3240 electrically connected to the memory channel structures 3220, and gate contact plugs 3235 electrically connected to word lines WL (refer to FIG. 8) of the gate stack structure 3210. As described above with reference to FIGS. 1 to 7, each of the semiconductor chips 2200 may include a second pattern layer 101*b* having a metal layer and a conductive pad 145, and may include a lower metal-semiconductor compound layer 141*a* contacting the second pattern layer 101*b* and the channel layer 140, and an upper metal-semiconductor compound layer 141*b* contacting the conductive pad 145 and the channel layer 140.

Each of the semiconductor chips 2200 may include a through-wiring electrically connected to the peripheral wirings 3110 of the first semiconductor structure 3100 and extending into the second semiconductor structure 3200. The through-wiring may be disposed outside the gate stack structure 3210, and may be further disposed to pass through the gate stack structure 3210. Each of the semiconductor chips 2200 may further include an input/output pad 2210 electrically connected to the peripheral wirings 3110 of the first semiconductor structure 3100 (refer to FIG. 9).

FIGS. 11 to 19 are cross-sectional views illustrating a method of manufacturing a semiconductor device 100 according to example embodiments. FIGS. 11, 12A, 16A, and 19 are cross-sectional views of FIG. 1, taken along line FIGS. 12B, 13, 14, and 15 are partially enlarged cross-sectional views of portion 'G' of FIG. 12A, and FIGS. 16B, 17, and 18 are partially enlarged cross-sectional views of portion 'H' of FIG. 16A.

Figure 11:
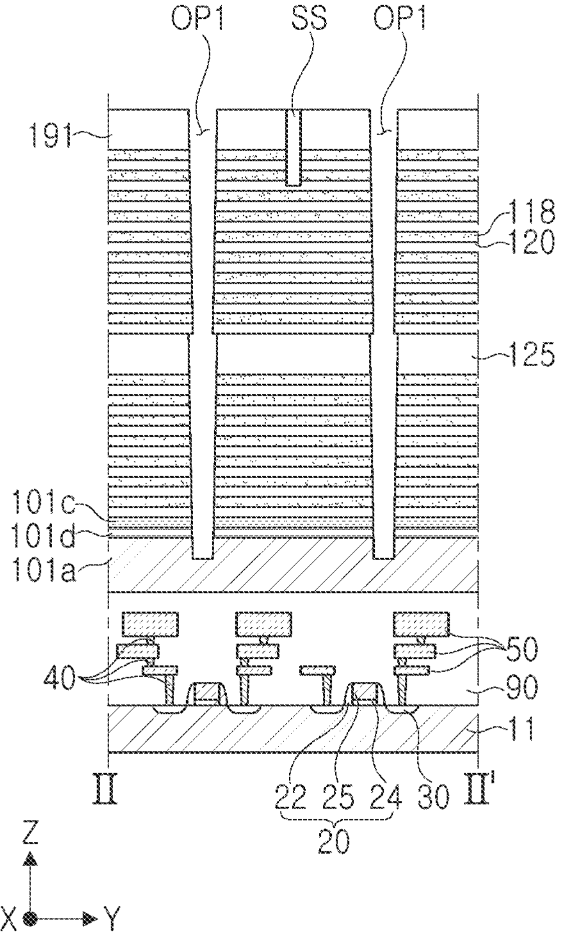
FIGS. 11 to 19 are cross-sectional views illustrating a method of manufacturing a semiconductor device according to example embodiments.

Referring to FIG. 11, a stack structure may be formed by alternately stacking interlayer insulating layers 120 and sacrificial layers 118, and a first opening OP1 passing through the stack structure may be formed.

First, circuit elements 20 may be formed on a first substrate 11, and a peripheral region insulating layer 90 covering the circuit elements 20, and circuit contact plugs 40 and circuit wiring lines 50 connected to the circuit elements 20 may be formed.

Next, a first pattern layer 101*a*, a fourth pattern layer 101*d*, and a third pattern layer 101*c* may be sequentially formed on the peripheral region insulating layer 90. The fourth pattern layer 101*d* may include first to third horizontal insulating layers. The first horizontal insulating layer and the third horizontal insulating layer may include the same material, and the first horizontal insulating layer and the second horizontal insulating layer may include different materials. For example, the first horizontal insulating layer and the third horizontal insulating layer may be formed of the same material as the interlayer insulating layers 120, and the second horizontal insulating layer may be formed of the same material as the sacrificial layers 118. The fourth pattern layer 101*d* may be a layer partially replaced with the second pattern layer 101*b* (refer to FIG. 2A) in a subsequent process.

Next, a stack structure may be formed by alternately stacking the sacrificial layers 118 and the interlayer insulating layers 120 on the third pattern layer 101*c* in the Z-direction. The sacrificial layers 118 may be layers partially replaced by gate electrodes 130 (refer to FIG. 2B) in a subsequent process. The sacrificial layers 118 may be formed of a material, different from that of the interlayer insulating layers 120, and may be formed of a material that may be etched with etching selectivity for the interlayer insulating layers 120 under specific etching conditions. For example, the interlayer insulating layers 120 may be formed of at least one of silicon oxide or silicon nitride, and the sacrificial layers 118 may be selected from silicon, silicon oxide, silicon carbide, and silicon nitride, but may be formed of a material, different from that of the interlayer insulating layers 120. According to embodiments, the sacrificial layers 118 may be polysilicon layers including impurities. In embodiments, thicknesses of the interlayer insulating layers 120 may not all be the same. The thickness of the interlayer insulating layers 120 and the sacrificial layers 118, and the number of films constituting them may be variously changed from those illustrated.

Next, a first opening OP1 passing through the stack structure may be formed.

After a first upper insulating layer 191 covering the stack structure is formed, the first opening OP1 passing through the first upper insulating layer 191 and the stack structure may be formed. The first opening OP1 may have a hole shape, and may expose side surfaces of the sacrificial layers 118 and side surfaces of the interlayer insulating layers 120. The first opening OP1 may pass through the fourth and third pattern layers 101*d* and 101*c*, together with the stack structure, to extend into the first pattern layer 101*a*. According to embodiments, the first opening OP1 may be in contact with an upper surface of the first pattern layer 101*a* without passing through the first pattern layer 101*a*. In an example embodiment, the first opening OP1 may have a pillar shape, and may include an inclined side surface, but inventive concepts are not limited thereto.

Figure 12A:
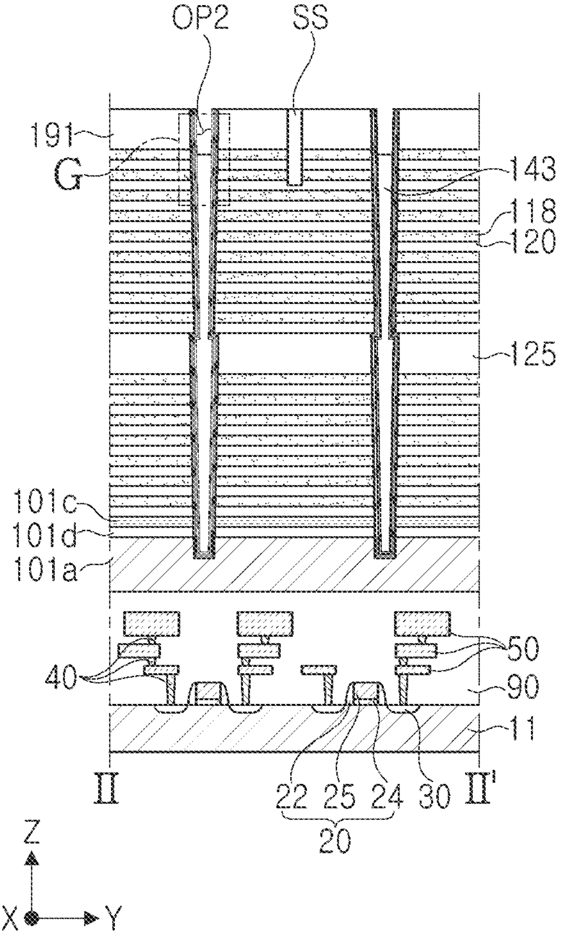
Figure 12B:
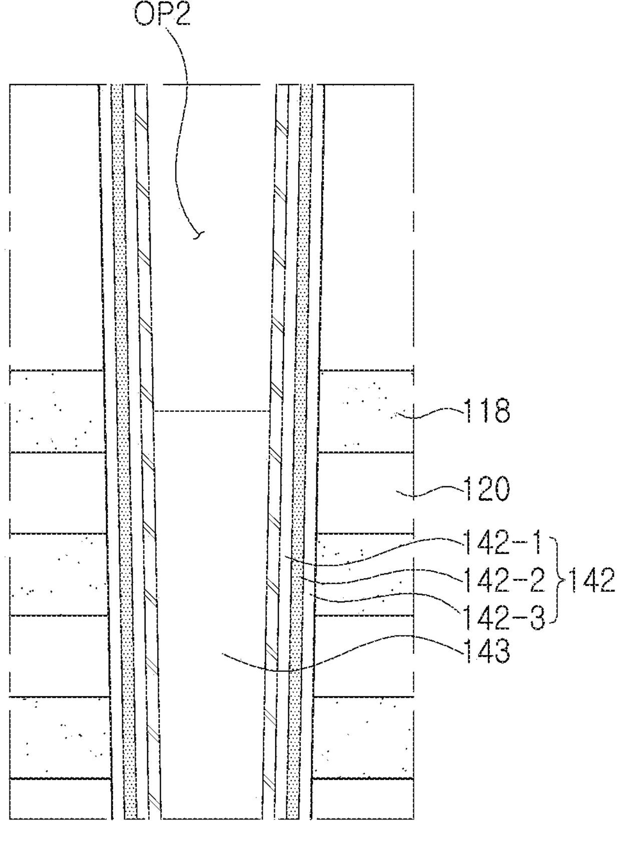

Referring to FIGS. 12A and 12B, an information storage structure 142, a channel layer 140, and a channel buried insulating layer 143 may be formed, and a portion of the channel buried insulating layer 143 may be removed to form a second opening OP2.

The information storage structure 142 including a blocking layer 142-3, an information storage layer 142-2, and a tunneling layer 142-1, sequentially covering a sidewall and a bottom surface of the first opening OP1 may be formed. Each of the blocking layer 142-3, the information storage layer 142-2, and the tunneling layer 142-1 may have a substantially uniform thickness, and may have substantially the same thickness as each other, but inventive concepts are not limited thereto.

The channel layer 140 may be formed on the tunneling layer 142-1, and may include a semiconductor material, for example, undoped polycrystalline silicon. The channel buried insulating layer 143 may be formed to fill a space between channel layers 140, and may be an insulating material.

The information storage structure 142 and the channel layer 140 may be formed by performing an atomic layer deposition (ALD) process, and planarizing the same in a chemical mechanical polishing (CMP) process, but inventive concepts are not limited thereto.

Next, the second opening OP2 may be formed by partially removing an upper end portion of the channel buried insulating layer 143. The second opening OP2 may be recessed to a depth, lower than an upper surface of an uppermost sacrificial layer 118 among the sacrificial layers 118. Therefore, a lower surface of the second opening OP2 may be located on a level, lower than the upper surface of the uppermost sacrificial layer 118. The lower surface of the second opening OP2 may be located on a higher level than an upper surface of an adjacent sacrificial layer 118 below the uppermost sacrificial layer 118.

In an example embodiment, the second opening OP2 may be formed by selectively etching and recessing only the channel buried insulating layer 143 with respect to channel layer 140. According to embodiments, the second opening OP2 may be formed by etching at least a portion of the channel layer 140 together.

Figure 13:
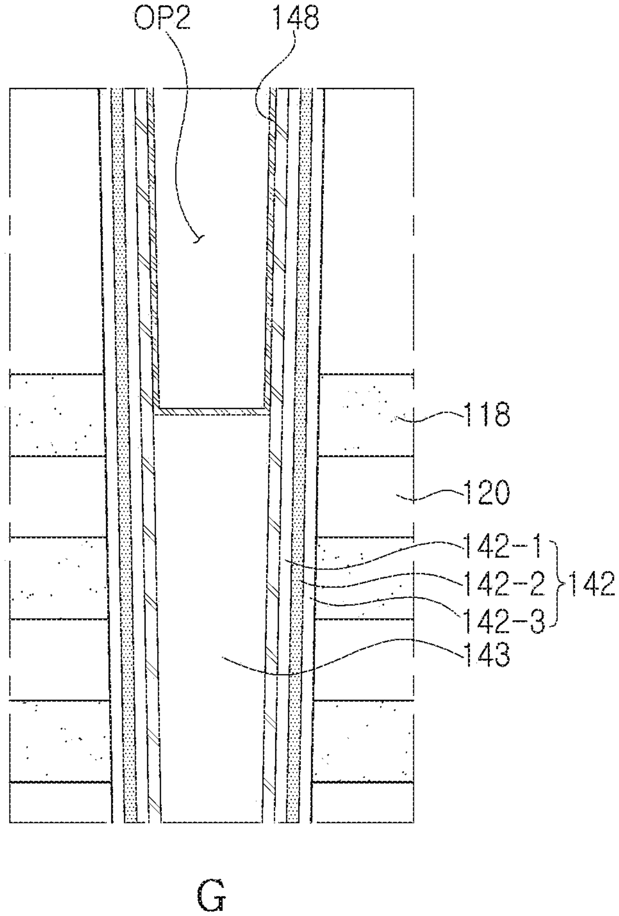

Referring to FIG. 13, an upper metal material layer 148 covering a sidewall and a bottom surface of the second opening OP2 may be formed.

The upper metal material layer 148 may conformally cover the sidewall and the bottom surface of the second opening OP2. The upper metal material layer 148 may include at least one of titanium (Ti), cobalt (Co), nickel (Ni), or tungsten (W).

Figure 14:
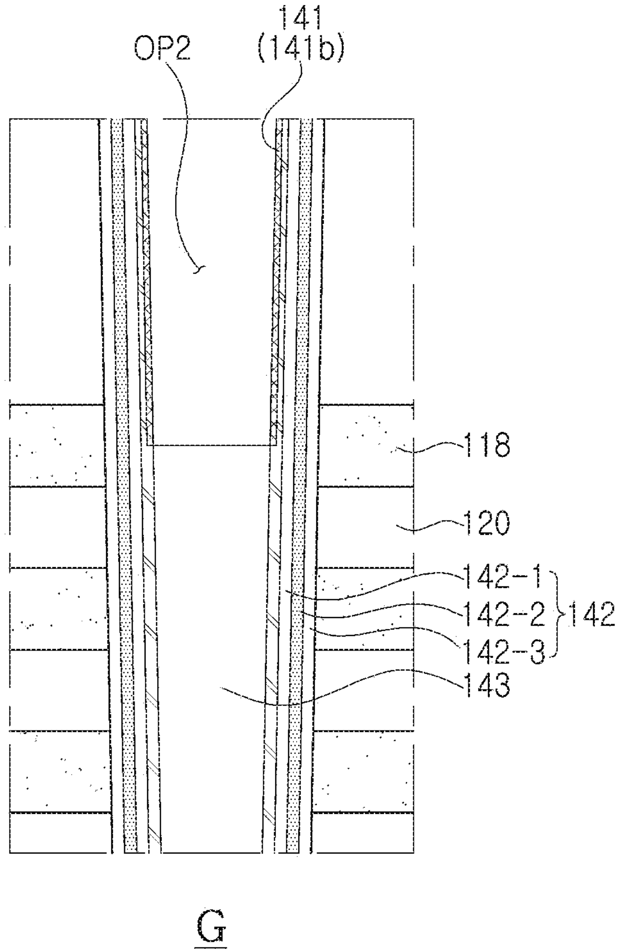

Referring to FIG. 14, the upper metal material layer 148 and the channel layer 140 may react to form an upper metal-semiconductor compound layer 141*b*.

A metal material of the upper metal material layer 148 may react with a semiconductor material of the channel layer by a silicide process or the like, to form the upper metal-semiconductor compound layer 141*b*. A portion of the upper metal material layer 148 may remain in a lower region without reacting with the channel buried insulating layer 143, but a remaining portion of the upper metal material layer 148 may be removed in a separate process. According to embodiments, a subsequent process may be performed without removing the remaining portion of the upper metal material layer 148.

In this operation, as the upper metal material layer 148 reacts with the channel layer 140 relatively more to form an upper metal-semiconductor compound layer contacting the information storage structure 142, the semiconductor device 100*d* of FIG. 4B may be provided.

Referring to FIGS. 12 and 14, as a depth of the second opening is recessed on a level higher than the upper surface of the uppermost sacrificial layer 118 and a subsequent process is performed using a relatively large amount of the upper metal material layer 148, the upper metal-semiconductor compound layer may extend onto a level lower than the upper surface of the uppermost sacrificial layer 118, to provide the semiconductor device 100*e* of FIG. 4C.

As a subsequent process is performed without this operation, or a reaction between the upper metal material layer 148 and the channel layer 140 is minimized by minimizing a heat treatment process in the subsequent process, the semiconductor device 100*f* of FIG. 4D may be provided.

Figure 15:
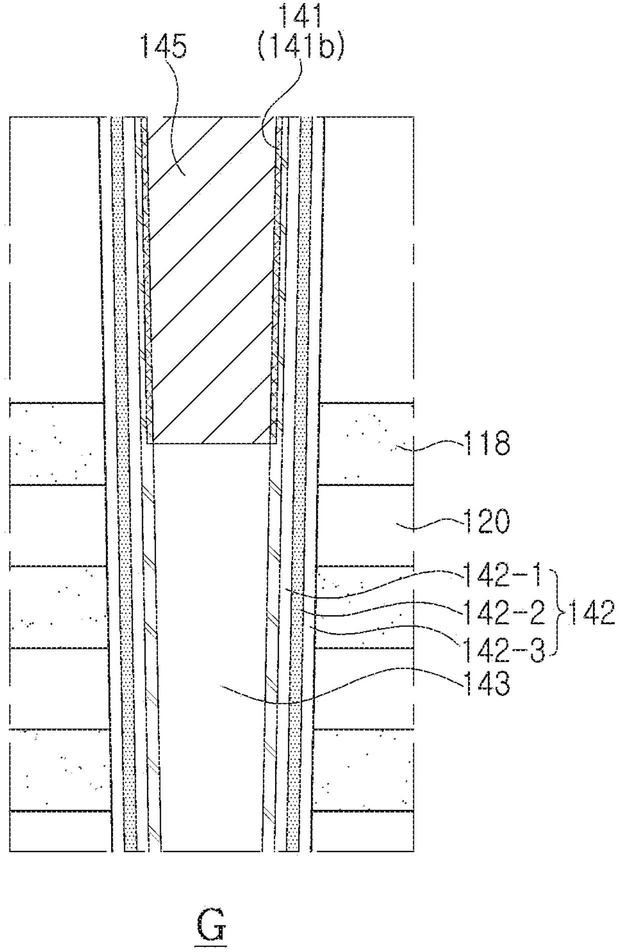

Referring to FIG. 15, a conductive pad 145 filling the second opening OP2 may be formed.

The conductive pad 145 may be formed in contact with the upper metal-semiconductor compound layer 141*b* by filling the second opening OP2 with a conductive material. The conductive pad 145 may include a metal material, for example, at least one of titanium (Ti), cobalt (Co), nickel (Ni), or tungsten (W). In an example embodiment, the conductive pad 145 may include the same metal element as a metal element of the upper metal-semiconductor compound layer 141*b*, but inventive concepts are not limited thereto, and may include another metal element. As the conductive pad 145 is formed of a metal material, contact resistance with the upper wiring structure 180 (FIG. 2B), which may be a metal layer formed in a subsequent process, may be relatively reduced, to provide a semiconductor device having improved electrical characteristics.

Figure 16A:
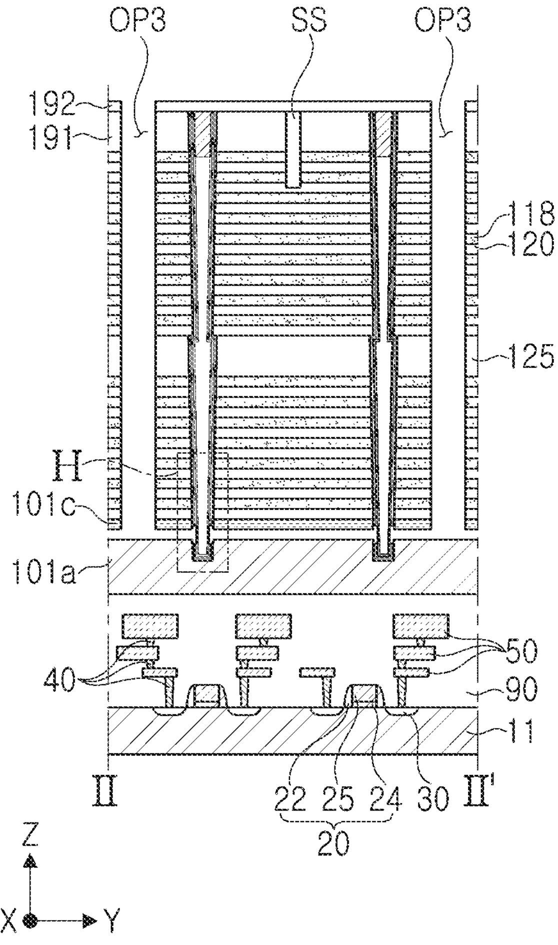
Figure 16B:
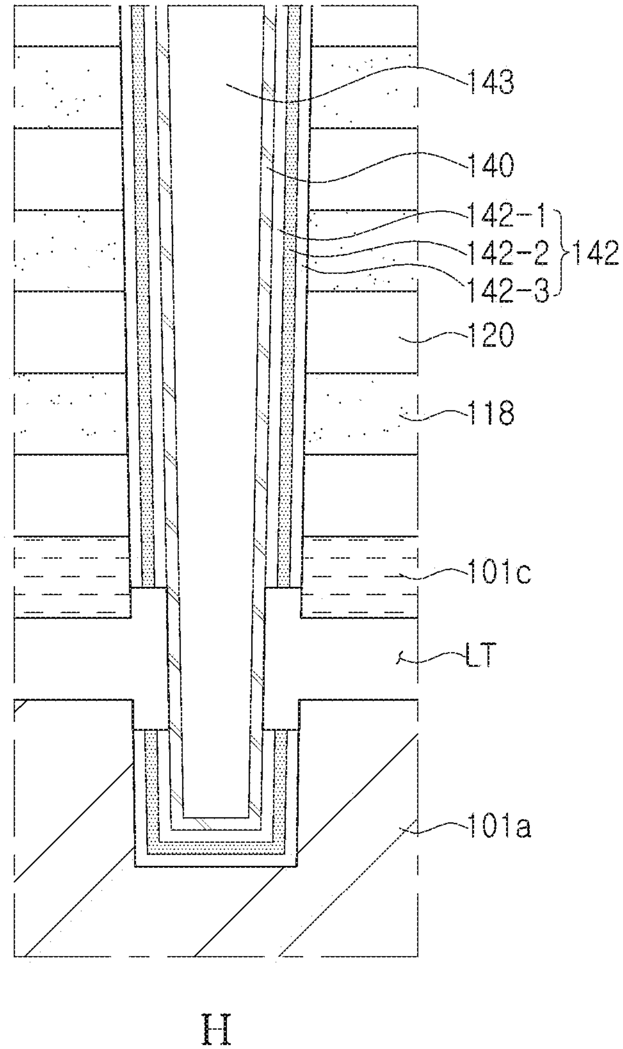

Referring to FIGS. 16A and 16B, third openings OP3 passing through the sacrificial layers 118 and the interlayer insulating layers 120 may be formed in regions corresponding to separation structures MS (see FIGS. 1 and 2B), and a tunnel portion LT may be formed by removing the fourth pattern layer 101*d* through the third openings OP3.

A second upper insulating layer 192 covering an upper surface of the first upper insulating layer 191 and an upper surface of the conductive pad 145 may be formed, and the third openings OP3 may be formed. The third openings OP3 may pass through the stack structure and the third pattern layer 101*c*, and may have a trench shape extending in the X-direction.

Next, separate sacrificial spacer layers may be formed in the third openings OP3, and the second horizontal insulating layer of the fourth pattern layer 101*d* may be exposed in an etch-back process, to remove the fourth pattern layer 101*d*. In the operation of removing the fourth pattern layer 101*d*, a portion of the information storage structure 142 exposed in a region from which the fourth pattern layer 101*d* is removed may also be removed to form the tunnel portion LT. A thickness of the tunnel portion LT between the first pattern layer 101*a* and the third pattern layer 101*c* may be thinner than a thickness of the tunnel portion LT in a region from which a portion of the information storage structure 142 is removed. For example, as an isotropic etching process is performed on the information storage structure 142 exposed by removing the fourth pattern layer 101*d*, the tunnel portion LT may expose portions of side surfaces of the first and third pattern layers 101*a* and 101*c*. At least a portion of the channel layer 140 may be exposed by the tunnel portion LT.

Figure 17:
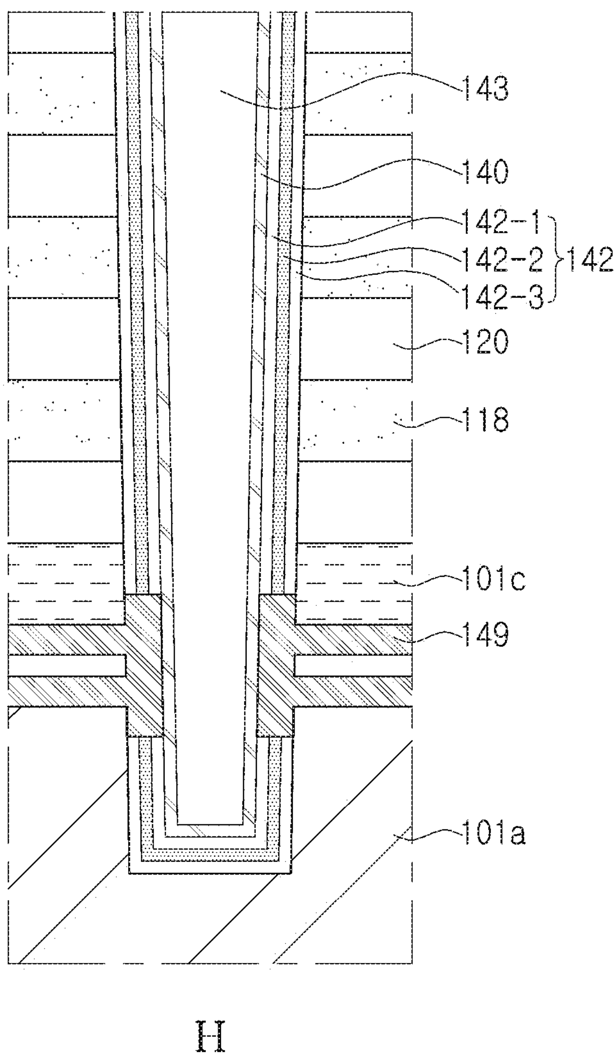

Referring to FIG. 17, a lower metal material layer 149 may be formed to conformally cover a space in the tunnel portion LT.

The lower metal material layer 149 covering the space in the tunnel portion LT in a substantially uniform thickness may be formed. The lower metal material layer 149 may be in contact with the channel layer 140. A thickness of the lower metal material layer 149 covering the tunnel portion LT may be adjusted according to a height of an upper surface of the lower metal-semiconductor compound layer 141*a* to be formed in a subsequent process. The lower metal material layer 149 may include at least one of titanium (Ti), cobalt (Co), nickel (Ni), or tungsten (W).

Figure 18:
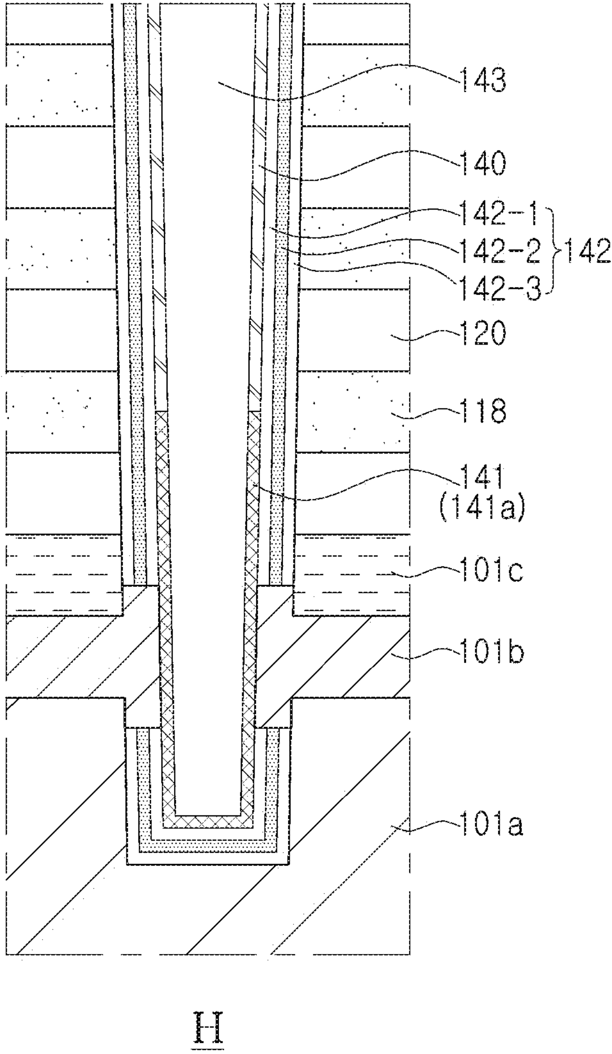

Referring to FIG. 18, a lower metal-semiconductor compound layer 141*a* may be formed, and a second pattern layer 101*b* may be formed.

The lower metal-semiconductor compound layer 141*a* may be formed by reacting the lower metal material layer 149 and the channel layer 140 in a silicide process or the like. The lower metal material layer 149 may selectively react with the channel layer 140 with respect to the first pattern layer 101*a*, the third pattern layer 101*c*, and the information storage structure 142, to substitute a portion of the channel layer 140 with the lower metal-semiconductor compound layer 141*a*. The upper surface of the lower metal-semiconductor compound layer 141*a* may be formed on a higher level than the lower surface of the lowermost sacrificial layer 118.

Next, the second pattern layer 101*b* may be formed by filling the tunnel portion LT with a metal material. In an example embodiment, the second pattern layer 101*b* may be formed by filling the same or different metal material without removing a remaining portion of the lower metal material layer 149, but inventive concepts are not limited thereto, and the second pattern layer 101*b* may be formed by removing the lower metal material layer 149 and filling a separate metal material. The second pattern layer 101*b* may include at least one of titanium (Ti), cobalt (Co), nickel (Ni), or tungsten (W). As the second pattern layer 101*b* includes a metal material, wiring resistance of the common source line may be relatively reduced, such that a semiconductor device having improved electrical characteristics may be provided.

Figure 19:
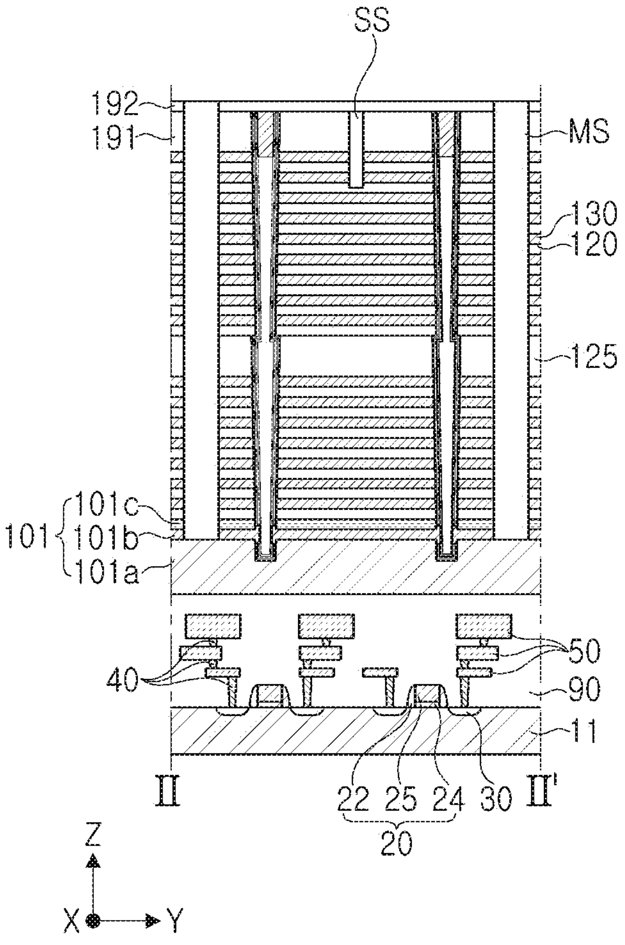

Referring to FIG. 19, the gate electrodes 130 may be formed by removing the sacrificial layers 118 exposed through the third openings OP3 and separation structures MS may be formed.

First, the sacrificial spacer layers covering the sidewalls of the third openings OP3 may be removed, and the sacrificial layers 118 may be selectively removed with respect to the interlayer insulating layers 120 through the third openings OP3. The sacrificial layers 118 may be selectively removed with respect to the interlayer insulating layers 120 using, for example, a wet etching process. Therefore, a plurality of tunnel portions may be formed between the interlayer insulating layers 120. In the etching process, for example, an ammonia-based chemical, a hydrofluoric acid-based chemical, a phosphoric acid-based chemical, a sulfuric acid-based chemical, or an acetic acid-based chemical may be used.

A gate dielectric layer may be formed by depositing a dielectric material having a uniform thickness while covering the interlayer insulating layers 120 in the plurality of tunnel portions, and a gate conductive layer may be formed by filling a conductive material between the gate dielectric layers, to form the gate electrodes 130. The conductive material may include a metal, polycrystalline silicon, or a metal silicide material. Next, after the dielectric material and the conductive material deposited in the third openings OP3 may be removed in an additional process, the separation structures MS may be formed by filling the third openings OP3 with an insulating material.

Next, the semiconductor device 100 of FIGS. 1 to 2B may be prepared by forming a third upper insulating layer 193 (see FIG. 2B) covering the separation structures MS and the second upper insulating layer 192, and forming upper contact structures 182 passing through the second and third upper insulating layers 192 and 193 to contact the conductive pad 145 and upper wiring patterns 184 disposed on the upper contact structures 182.

According to embodiments of inventive concepts, a semiconductor device having improved electrical characteristics and/or a data storage system including the same may be provided by forming at least a portion of a pattern structure as a metal layer to reduce wiring resistance of a common source line or by forming a conductive pad as a metal layer to reduce contact resistance with an upper wiring.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Various advantages, features, and effects of inventive concepts are not limited to the above, and will be more easily understood in the process of describing specific embodiments of inventive concepts.

While some example embodiments have been illustrated and described above, it will be apparent to those skilled in the art that modifications and variations could be made without departing from the scope of inventive concepts as defined by the appended claims.

What is claimed is:

1. A semiconductor device comprising:

a lower structure;

a pattern structure including a first pattern layer, a second pattern layer, and a third pattern layer, the first pattern layer, the second pattern layer, and the third pattern layer being sequentially stacked on the lower structure, and the first pattern layer and the third pattern layer having a semiconductor material;

the second pattern layer having a first metal layer;

a plurality of gate electrodes stacked on the pattern structure and spaced apart from each other in a first direction, the first direction being perpendicular to an upper surface of the pattern structure, and the plurality of gate electrodes including a lower gate electrode in a lower portion within the plurality of gate electrodes; and a channel structure passing through the plurality of gate electrodes, the channel structure including a semiconductor channel layer and a metal-semiconductor compound layer, at least a portion of the semiconductor channel layer being in contact with a bottom portion of the metal-semiconductor compound layer, the metal-semiconductor compound layer being in contact with the semiconductor channel layer and in contact with the first metal layer of the second pattern layer, the channel structure passing through at least the second pattern layer and the third pattern layer and the channel structure extending into the first pattern layer, the metal-semiconductor compound layer contacting the first metal layer of the second pattern layer, and at least a portion of the metal-semiconductor compound layer overlapping the lower gate electrode in a second direction, the second direction being perpendicular to the first direction.

2. The semiconductor device of claim 1, wherein a thickness of the metal-semiconductor compound layer is equal to a thickness of the semiconductor channel layer, and a side surface of the semiconductor channel layer is coplanar with a side surface of the metal-semiconductor compound layer.

3. The semiconductor device of claim 1, wherein the metal-semiconductor compound layer comprises a same metal element as the second pattern layer, and the metal-semiconductor compound layer comprises a same semiconductor element as the semiconductor channel layer.

4. The semiconductor device of claim 1, wherein the first pattern layer and the third pattern layer comprise polycrystalline silicon.

5. The semiconductor device of claim 1, wherein the lower gate electrode is one of a plurality of lower gate electrodes included in the lower portion of the plurality of gate electrodes, and the metal-semiconductor compound layer horizontally overlaps at least two lower gate electrodes among the plurality of lower gate electrodes.

6. The semiconductor device of claim 1, wherein a first portion of the semiconductor channel layer is below the metal-semiconductor compound layer, and a second portion of the semiconductor channel layer is above the metal-semiconductor compound layer.

7. The semiconductor device of claim 1, wherein the channel structure further comprises an information storage structure, the information storage structure covers at least a portion of an outer side surface of the semiconductor channel layer and at least a portion of an outer side surface of the metal-semiconductor compound layer, and the second pattern layer passes through the information storage structure and contacts the metal-semiconductor compound layer.

8. The semiconductor device of claim 7, wherein the lower structure comprises a base substrate and a peripheral circuit disposed on the base substrate, and a thickness of the second pattern layer in a region between the first pattern layer and the third pattern layer is thinner than a thickness of the second pattern layer in a region passing through the information storage structure.

9. The semiconductor device of claim 1, wherein the channel structure further comprises:

a channel buried insulating layer; and a conductive pad on the channel buried insulating layer, wherein the channel buried insulating layer covers an inner side surface of the semiconductor channel layer.

10. The semiconductor device of claim 9, wherein the plurality of gate electrodes includes an upper gate electrode in an upper portion within the plurality of gate electrodes, the channel structure further comprises an upper metal-semiconductor compound layer extending from an outer side surface of the conductive pad, at least a portion of the upper metal-semiconductor compound layer horizontally overlaps the upper gate electrode in the second direction, the conductive pad comprises a second metal layer, and a lower surface of the second metal layer is located on a level higher than an upper surface of the upper gate electrode.

11. The semiconductor device of claim 9, wherein the plurality of gate electrodes comprise an upper gate electrode in an upper portion within the gate electrodes, the conductive pad comprises a second metal layer, and at least a portion of the conductive pad horizontally overlaps the upper gate electrode in the second direction.

12. The semiconductor device of claim 11, wherein the semiconductor channel layer extends onto an outer side surface of the conductive pad, and the channel structure further includes an upper metal-semiconductor compound layer disposed on the semiconductor channel layer and the outer side surface of the conductive pad.

13. A semiconductor device comprising:
a first horizontal conductive layer including a metal layer;
a second horizontal conductive layer on the first horizontal conductive layer and including a semiconductor material;
a plurality of gate electrodes stacked on the second horizontal conductive layer and spaced apart from each other in a first direction, the first direction being perpendicular to an upper surface of the first horizontal conductive layer; and
a channel structure passing through the plurality of gate electrodes and the second horizontal conductive layer, the channel structure including a semiconductor channel layer and a lower metal-semiconductor compound layer, at least a portion of the semiconductor channel layer being in contact with a bottom portion of the lower metal-semiconductor compound layer,
the lower metal-semiconductor compound layer being in contact with the semiconductor channel layer and in contact with the metal layer of the first horizontal conductive layer,
the first horizontal conductive layer being in contact with a lower surface of the second horizontal conductive layer,
the first horizontal conductive layer covering at least a portion of a side surface of the second horizontal conductive layer,
the lower metal-semiconductor compound layer extending in a direction facing the plurality of gate electrodes from a region contacting the first horizontal conductive layer, and
a level of an upper surface of the lower metal-semiconductor compound layer being higher than an upper surface of the second horizontal conductive layer.

14. The semiconductor device of claim 13, wherein the channel structure further comprises:
a channel buried insulating layer;
a conductive pad covering the channel buried insulating layer; and
an upper metal-semiconductor compound layer contacting the semiconductor channel layer and the conductive pad.

15. The semiconductor device of claim 13, wherein the channel structure further comprises an information storage structure,
the information storage structure covers at least a portion of an outer side surface of the semiconductor channel layer and at least a portion of an outer side surface of the lower metal-semiconductor compound layer,
the information storage structure comprises a tunneling layer, a blocking layer, and an information storage layer between the tunneling layer and the blocking layer, and
the first horizontal conductive layer passes through the information storage structure and contacts the lower metal-semiconductor compound layer.

16. The semiconductor device of claim 14, wherein
the upper metal-semiconductor compound layer covers an outer side surface of the conductive pad, and
the semiconductor channel layer covers an outer side surface of the upper metal-semiconductor compound layer.

17. The semiconductor device of claim 14, wherein the plurality of gate electrodes comprise a lower gate electrode, a plurality of intermediate gate electrodes on the lower gate electrode, and an upper gate electrode on the plurality of intermediate gate electrodes,
a portion of the upper metal-semiconductor compound layer overlaps the upper gate electrode in a second direction,
the second direction is perpendicular to the first direction, and
a portion of the lower metal-semiconductor compound layer overlaps the lower gate electrode in the second direction.

18. The semiconductor device of claim 17, wherein a portion of the conductive pad overlaps the upper gate electrode in the second direction.

19. A data storage system comprising:
a semiconductor storage device including a lower structure including circuit elements, a pattern structure including a plurality of pattern layers sequentially stacked on the lower structure, a plurality of gate electrodes stacked on the pattern structure and spaced apart from each other in a first direction, a channel structure passing through the plurality of gate electrodes, and an input/output pad electrically connected to the circuit elements,
the plurality of pattern layers including a first pattern layer, a second pattern layer, and a third pattern layer, the first pattern layer, the second pattern layer, and the third pattern layer being sequentially stacked on the lower structure,
the first direction being perpendicular to an upper surface of the pattern structure,
the plurality of gate electrodes including a lower gate electrode in a lower portion within the gate electrodes,
the channel structure including a semiconductor channel layer and a metal-semiconductor compound layer, at least a portion of the semiconductor channel layer being in contact with a bottom portion of the metal-semiconductor compound layer,
the metal-semiconductor compound layer being in contact with the semiconductor channel layer and in contact with the second pattern layer,
the channel structure passing through at least the second pattern layer and the third pattern layer and the channel structure extending into the first pattern layer,
the first pattern layer and the third pattern layer comprise a semiconductor material,
the second pattern layer having a first metal layer contacting the metal-semiconductor compound layer, and
at least a portion of the metal-semiconductor compound layer overlapping the lower gate electrode in a second direction, the second direction being perpendicular to the first direction; and
a controller electrically connected to the semiconductor storage device through the input/output pad and configured to control the semiconductor storage device.

20. The data storage system of claim 19, wherein the plurality of gate electrodes further include an upper gate electrode in an upper portion within the plurality of gate electrodes, the channel structure further comprises a channel buried insulating layer and a conductive pad, the channel buried insulating layer covers an inner side surface of the semiconductor channel layer, the conductive pad is on the channel buried insulating layer, the conductive pad comprises a second metal layer, and a lower surface of the conductive pad is located at a level lower than an upper surface of the upper gate electrode.

* * * * *